United States Patent
Baek

(10) Patent No.: US 11,557,603 B2
(45) Date of Patent: Jan. 17, 2023

(54) SEMICONDUCTOR DEVICES

(71) Applicant: Samsung Electronics Co., Ltd., Suwon-si (KR)

(72) Inventor: Seokcheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 17/013,724

(22) Filed: Sep. 7, 2020

(65) Prior Publication Data

US 2021/0151462 A1 May 20, 2021

(30) Foreign Application Priority Data

Nov. 18, 2019 (KR) .................. 10-2019-0147722

(51) Int. Cl.
| | |
|---|---|
| *H01L 27/11582* | (2017.01) |
| *H01L 27/11565* | (2017.01) |
| *H01L 27/11556* | (2017.01) |
| *H01L 27/11519* | (2017.01) |
| *H01L 27/11526* | (2017.01) |
| *H01L 27/11573* | (2017.01) |
| *H01L 27/11578* | (2017.01) |
| *H01L 27/1158* | (2017.01) |

(52) U.S. Cl.
CPC .......... *H01L 27/11582* (2013.01); *H01L 27/11519* (2013.01); *H01L 27/11526* (2013.01); *H01L 27/11556* (2013.01); *H01L 27/11565* (2013.01); *H01L 27/11573* (2013.01); *H01L 27/11578* (2013.01); *H01L 27/1158* (2013.01)

(58) Field of Classification Search
CPC .......... H01L 27/11578; H01L 27/1158; H01L 27/11582
See application file for complete search history.

(56) References Cited

U.S. PATENT DOCUMENTS

| | | | |
|---|---|---|---|
| 8,828,884 B2 | 9/2014 | Lee et al. | |
| 9,029,938 B2 | 5/2015 | Nakaki | |
| 9,356,038 B2 * | 5/2016 | Lee | .................. H01L 27/11548 |
| (Continued) | | | |

FOREIGN PATENT DOCUMENTS

| | | |
|---|---|---|
| JP | 2013-055136 A | 3/2013 |
| KR | 10-2015-0110966 A | 10/2015 |
| (Continued) | | |

*Primary Examiner* — David A Zarneke
(74) *Attorney, Agent, or Firm* — Muir Patent Law, PLLC

(57) ABSTRACT

A semiconductor device includes gate electrodes stacked to be spaced apart from each other on a substrate in a first direction, extending in a second direction, and including pad regions bent in a third direction, sacrificial insulating layers extending from the gate electrodes to be stacked alternately with the interlayer insulating layers, separation regions penetrating through the gate electrodes, extending in the second direction, and spaced apart from each other to be parallel to each other, and a through-wiring region spaced apart from the separation regions to overlap the pad regions between the separation regions adjacent to each other and including contact plugs penetrating through the pad regions. The through-wiring region includes slit regions, and each of the slit regions is disposed to penetrate through the sacrificial insulating layers on one side of a respective pad region.

20 Claims, 32 Drawing Sheets

(56) References Cited

U.S. PATENT DOCUMENTS

| | | | |
|---|---|---|---|
| 9,520,402 B1 | 12/2016 | Haller et al. | |
| 10,177,224 B1 * | 1/2019 | Park | H01L 45/1233 |
| 10,340,281 B2 | 7/2019 | Jiang et al. | |
| 10,515,997 B2 * | 12/2019 | Iguchi | H01L 27/1052 |
| 11,088,160 B2 * | 8/2021 | Kim | H01L 27/11575 |
| 2013/0056818 A1 | 3/2013 | Iino | |
| 2015/0270165 A1 | 9/2015 | Hyun | |
| 2017/0117222 A1 | 4/2017 | Kim et al. | |
| 2018/0301460 A1 | 10/2018 | Yoo et al. | |
| 2018/0330985 A1 | 11/2018 | Yu et al. | |
| 2020/0091170 A1 | 3/2020 | Baek | |

FOREIGN PATENT DOCUMENTS

| | | | |
|---|---|---|---|
| KR | 10-2017-0046892 A | 5/2017 | |
| KR | 10-2020-0030760 A | 3/2020 | |

\* cited by examiner

SEMICONDUCTOR DEVICES

CROSS-REFERENCE TO RELATED APPLICATION(S)

This application claims benefit of priority to Korean Patent Application No. 10-2019-0147722 filed on Nov. 18, 2019 in the Korean Intellectual Property Office, the disclosure of which is incorporated herein by reference in its entirety.

BACKGROUND

The present disclosure relates to semiconductor devices, and more particularly, to semiconductor devices including a plurality of slit regions and pad regions in a memory cell region.

Semiconductor devices are typically needed to process large amounts of data while volumes thereof are gradually decreasing. Thus, it is important to increase integration density of semiconductor elements constituting semiconductor devices. Accordingly, as one method of improving the integration density of semiconductor devices, a semiconductor device having a vertical transistor structure, rather than a conventional planar transistor structure, has been proposed.

SUMMARY

Example embodiments provide a semiconductor device having improved reliability.

According to an example embodiment, a semiconductor device includes a peripheral circuit region provided on a first substrate and including circuit elements and a wiring structure on the circuit elements, a memory cell region provided on a second substrate disposed above the first substrate and including gate electrodes stacked to be spaced apart from each other in a first direction, perpendicular to an upper surface of the second substrate, in a first region of the second substrate and extending in a form of a staircase in a second direction, perpendicular to the first direction in a second region of the second substrate, interlayer insulating layers stacked alternately with the gate electrodes, channel structures disposed in the first region, to penetrate through the gate electrodes and to extend in the first direction, each including a channel layer, and a through-wiring region disposed in the second region and including sacrificial insulating layers, extending from the gate electrodes to be stacked alternately with the interlayer insulating layers, and contact plugs electrically connecting the gate electrodes and the wiring structure to each other. The gate electrodes include pad regions disposed to overlap the through-wiring region on end portions of the gate electrodes and exposed with respect to the interlayer insulating layers and the sacrificial insulating layers. The through-wiring region includes slit regions disposed to respectively penetrate through the sacrificial insulating layers on one side of respective pad regions.

According to an example embodiment, a semiconductor device includes a peripheral circuit region provided on a first substrate and including circuit elements, a memory cell region provided on a second substrate disposed above the first substrate and including gate electrodes, stacked to be spaced apart from each other on the second substrate in a first direction and extending by different lengths in a second direction, perpendicular to the first direction, and a cell region insulating layer covering the gate electrodes, and a through-wiring region including sacrificial insulating layers disposed to extend from the gate electrodes. Each of the gate electrodes includes a pad region bent to extend in a third direction, perpendicular to the first and second directions, and to protrude from an end portion of the pad region in the second direction to the through-wiring region, and opposite side surfaces of the pad region in the second direction are covered with the cell region insulating layer.

According to an example embodiment, a semiconductor device includes gate electrodes stacked to be spaced apart from each other on a substrate in a first direction, perpendicular to an upper surface of the substrate, extending in a second direction, perpendicular to the first direction, and including pad regions bent in a third direction, perpendicular to the first and second directions, interlayer insulating layers stacked alternately with the gate electrodes, channel structures penetrating through the gate electrodes, extending in the first direction, and including a channel layer, separation regions penetrating through the gate electrodes, extending in the second direction, and spaced apart from each other to be parallel to each other, and a through-wiring region spaced apart from the separation regions to overlap the pad regions between the separation regions adjacent to each other, including contact plugs penetrating through the pad regions, and including sacrificial insulating layers extending from the gate electrodes to be stacked alternately with the interlayer insulating layers. The through-wiring region includes slit regions, and each of the slit regions is disposed to penetrate through the sacrificial insulating layers on one side of a respective pad region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
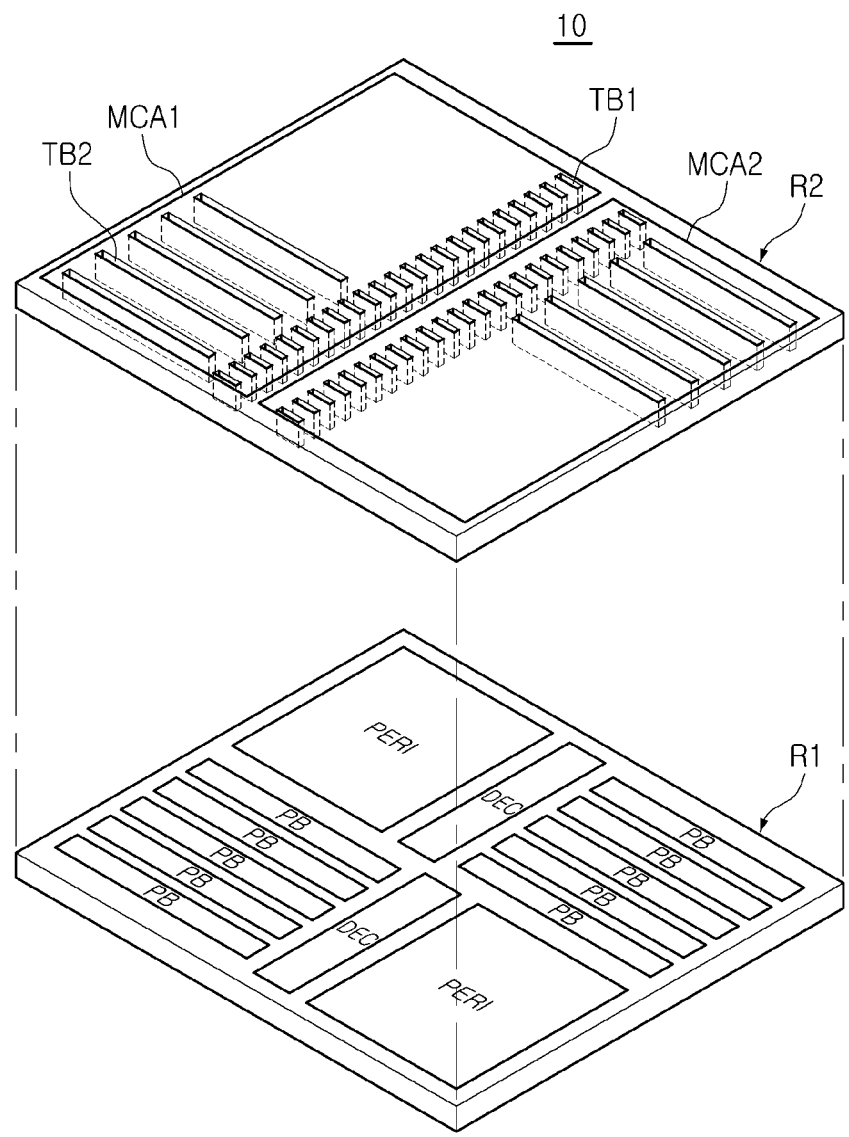
FIG. 1 illustrates a schematic layout of a semiconductor device according to example embodiments.

FIG. 1 illustrates a schematic layout of a semiconductor device according to example embodiments.

Referring to FIG. 1, a semiconductor device 10 may include first and second regions R1 and R2 stacked in a vertical direction. The first region R1 may include a first peripheral circuit PERI including a row decoder DEC and a page buffer PB, and a second peripheral circuit PERI. The second region R2 may include memory cell arrays MCA1 and MCA2 and first and second through-wiring regions TB1 and TB2.

In the first region R1, the row decoder DEC may decode an input address to generate and transmit driving signals of a wordline. The page buffer PB may be connected to the memory cell arrays MCA1 and MCA2 through bitlines to read information (e.g., data) stored in memory cells. The second peripheral circuit PERI may be regions, including a control logic circuit and a voltage generator, and may include, for example, a latch circuit, a cache circuit, and/or a sense amplifier. The first region R1 may further include a pad region. In this case, the pad region may include an electrostatic discharge (ESD) element and/or a data input/output circuit.

In the first region R1, at least a portion of the various circuit regions DEC, PB, and PERI may be disposed below the memory cell arrays MCA1 and MCA2 in the second region R2. For example, the page buffer PB may be disposed below the memory cell arrays MCA1 and MCA2 to overlap the memory cell arrays MCA1 and MCA2. However, in example embodiments, circuits included in the first region R1 and arrangement thereof may be changed in various ways. Accordingly, circuits disposed to overlap the memory cell arrays MCA1 and MCA2 may also be changed in various ways.

In the second region R2, the memory cell arrays MCA1 and MCA2 may be disposed to be spaced apart from each other. In example embodiments, the number and arrangement of the memory cell arrays MCA1 and MCA2, disposed in the second region R2, may be changed in various ways.

The first and second through-wiring regions TB1 and TB2 may include a wiring structure connected to the first region R1 through the second region R2. The first through-wiring regions TB1 may be disposed on at least one side of the memory cell arrays MCA1 and MCA2 and may include, for example, a wiring structure such as a contact plug, or the like, electrically connected to the row decoder DEC in the first region R1. The second through-wiring regions TB2 may be disposed at predetermined intervals in the memory cell arrays MCA1 and MCA2 and may include, for example, a wiring structure electrically connected to the page buffer PB in the first region R1. The number of the first through-wiring regions TB1 may be greater than the number of the second through-wiring regions TB2, but the shape, number, arrangement, and the like, of the first and second through-wiring regions TB1 and TB2 may be variously changed in example embodiments.

Figure 2:
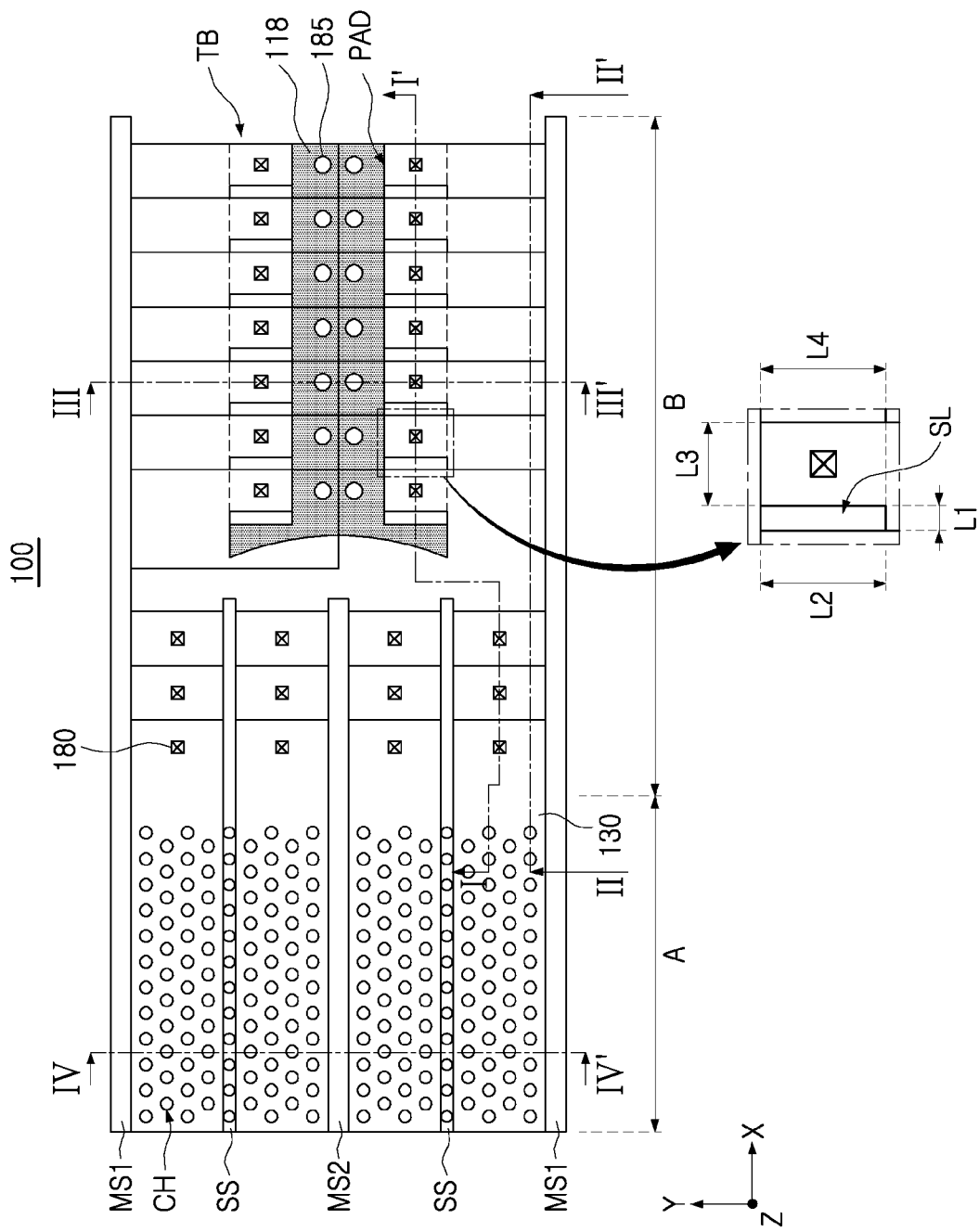
FIG. 2 is a schematic plan view of a semiconductor device according to example embodiments.

FIG. 2 is a schematic plan view of a semiconductor device according to example embodiments.

FIGS. 3A to 3D are schematic cross-sectional views of a semiconductor device according to example embodiments.

FIGS. 3A to 3D illustrate cross sections taken along lines I-I', II-II', III-III', and IV-IV' in FIG. 2, respectively.

Referring to FIGS. 2 and 3A to 3D, a semiconductor device 100 may include a memory cell region CELL, a peripheral circuit region PERI (herein, the peripheral circuit region PERI corresponds to the first and second peripheral circuits PERI), and a through-wiring region TB. In example embodiments, the memory cell region CELL may be disposed on an upper end of the peripheral circuit region PERI, and the through-wiring region TB may be disposed to extend to the peripheral circuit region PERI through the memory cell region CELL. In other example embodiments, the memory cell region CELL may be disposed below the peripheral circuit region PERI. The peripheral circuit region PERI may correspond to the first region R1 in FIG. 1, and the memory cell region CELL may include the memory cell arrays MCA1 and MCA2 in FIG. 1.

The memory cell region CELL may include a substrate 101 having a first region A and a second region B, gate electrodes 130 stacked on the substrate 101, and first and second separation regions MS1 and MS2 extending through a stacked structure of the gate electrodes 130, upper separation regions SS penetrating through a portion of the stacked structure, and channel structures CH disposed to penetrate through the stacked structure. The memory cell region CELL may further include a substrate insulating layer 170 in the substrate 101, interlayer insulating layers 120 stacked alternately with the gate electrodes 130 on the substrate 101, a cell region insulating layer 190 covering the gate electrodes 130, and a portion of contact plugs 180.

The first region A of the substrate 101 may be a region in which the gate electrodes 130 are vertically stacked and the channel structures CH are disposed. The second region B of the substrate 101 may be a region, in which the gate electrodes 130 extend by different lengths from each other, and may correspond to a region for electrically connecting the memory cells to the peripheral circuit region PERI. The second region B may be disposed on at least one end of the first region A in at least one direction, for example, an X direction.

The substrate 101 may have an upper surface extending in the X direction and a Y direction. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a polycrystalline layer or an epitaxial layer.

The substrate insulating layer 170 may be disposed in a region, in which a portion of the substrate 101 is removed, and may be surrounded by the substrate 101. The substrate insulating layer 170 may have an upper surface, disposed to be substantially coplanar with an upper surface of the substrate 101, and a lower surface disposed to be coplanar with a lower surface of the substrate 101 or disposed at a lower level than the lower surface of the substrate 101. The substrate insulating layer 170 may include a silicon oxide or a silicon oxynitride. In example embodiments, the substrate insulating layer 170 may be disposed to surround side surfaces of each of the contact plugs 180.

The gate electrodes 130 may be vertically stacked and spaced apart from each other on the substrate 101 to form a stacked structure. The gate electrodes 130 may include electrodes, sequentially forming a ground select transistor, memory cells, and a string select transistor from an upper portion of the substrate 101. The number of gate electrodes 130, forming the memory cells, may be determined depending on capacity of the semiconductor device 100. In example embodiments, one or more gate electrodes 130 may constitute each of the string select transistor and the ground select transistor, and may have the same or different structure as or from the gate electrodes 130 of the memory cells. The gate electrodes 130 may further a gate electrode 130 constituting an erase transistor used in an erase operation using gate-induced drain leakage (GIDL) mechanism and disposed above the gate electrode 130 constituting the string select transistor. A portion of the gate electrodes 130, for example, gate electrodes 130 adjacent to the gate electrode 130 constituting the string select transistor and the ground select transistor, may be dummy gate electrodes.

Figure 3A:
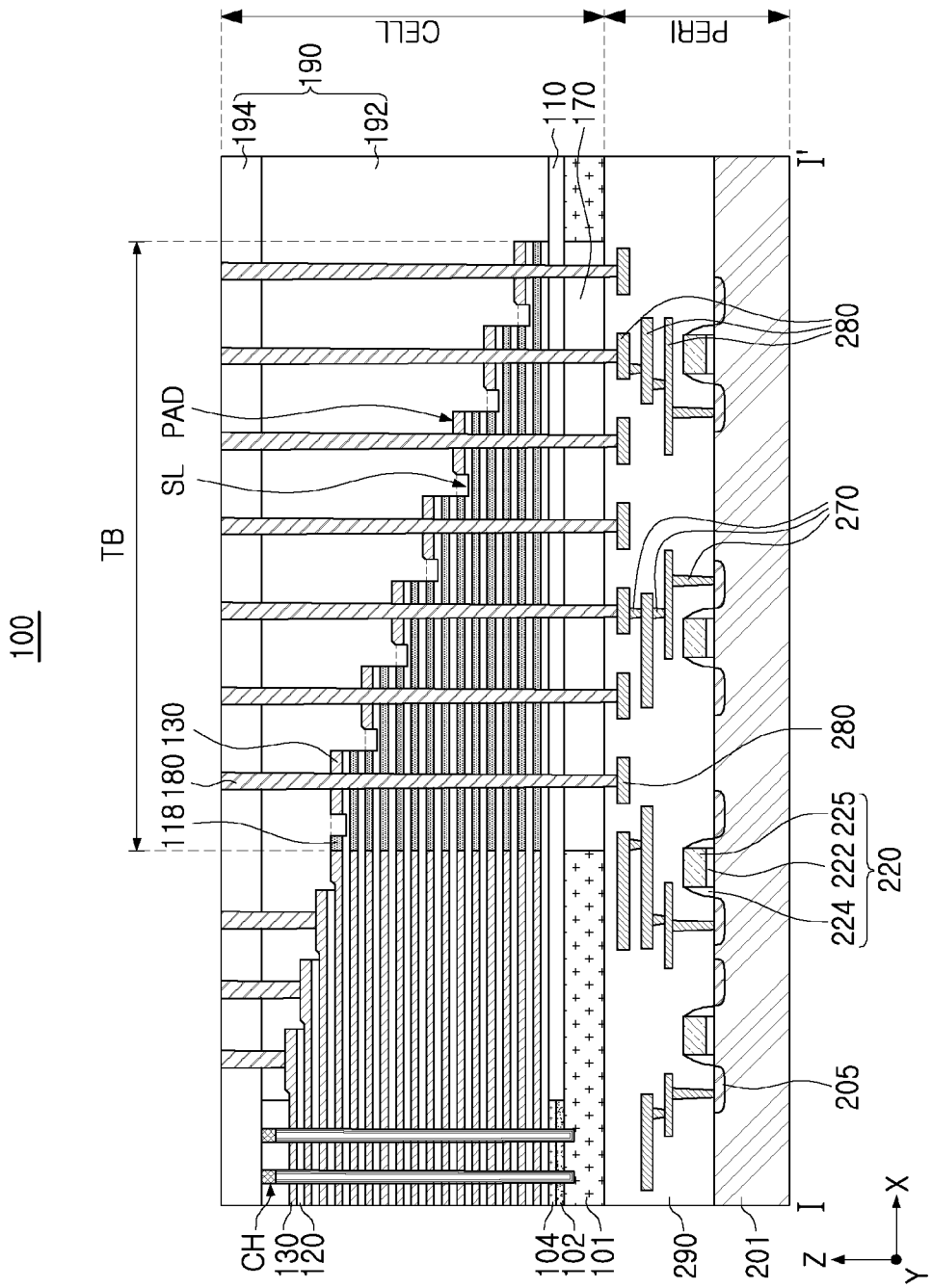
FIGS. 3A to 3D are schematic cross-sectional views of a semiconductor device according to example embodiments.
Figure 3B:
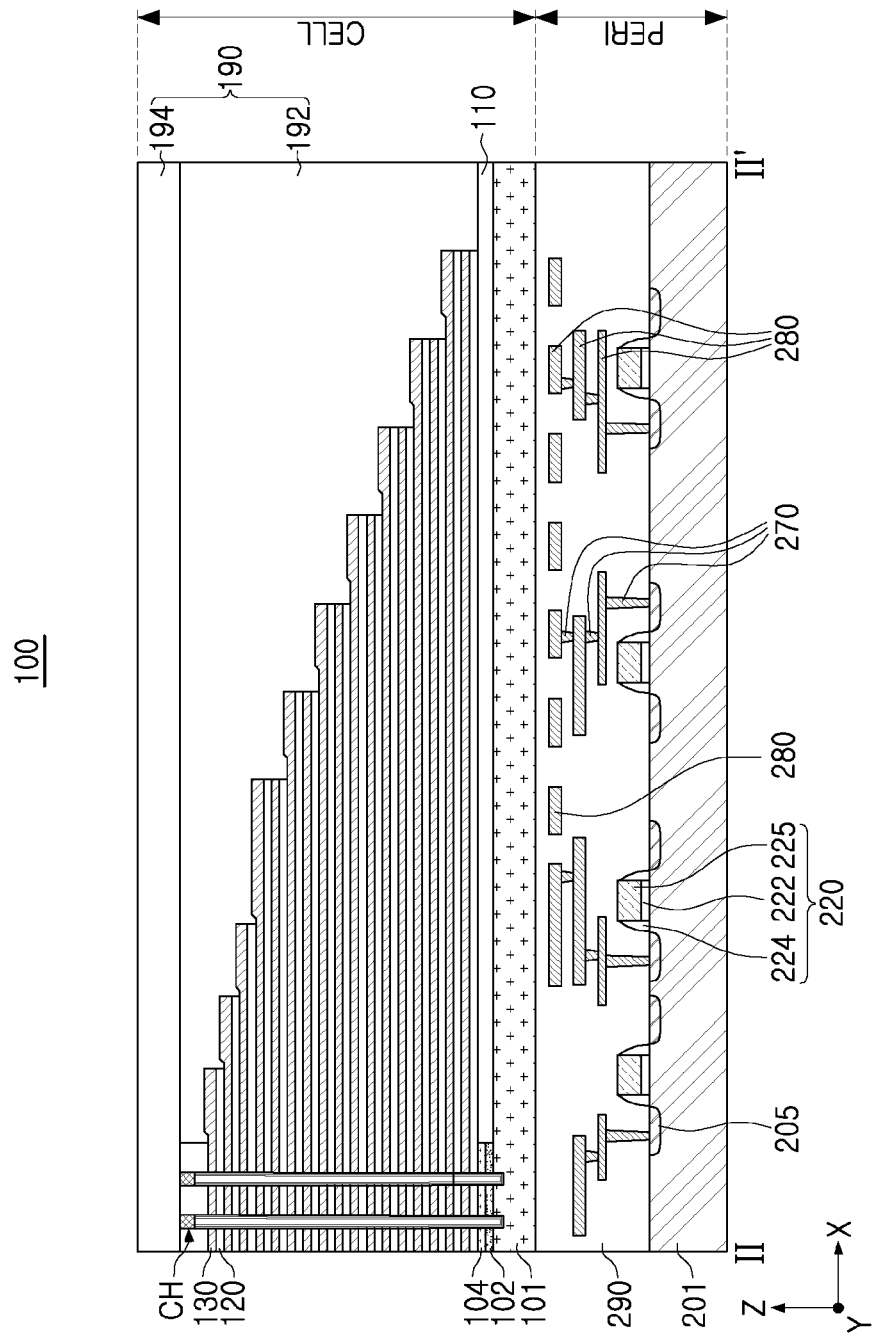

The gate electrodes 130 may be vertically stacked and spaced apart from each other on the first region A, and may extend by different lengths from the first region A to the second region B to form a staircase-shaped step structure. As illustrated in FIG. 3B, in at least a portion of the gate electrodes 130 except for a portion of uppermost and lowermost gate electrodes 130, a predetermined number of, for example, two, four, or six gate electrodes 130 may constitute a single gate group to form a step structure between the gate groups in the X direction. The gate electrodes 130, constituting the single gate group, may also be disposed to form a step structure in the Y direction.

Due to the step structure, the gate electrodes 130 may provide end portions exposed upwardly of the interlayer insulating layers 120 while forming a staircase shape in which an underlying gate electrode 130 extends longer than an overlying gate electrode 130. On the end portions, the gate electrodes 130 may have upwardly increased thicknesses. As illustrated in FIG. 2, the gate electrodes 130 may have pad regions PAD disposed such that the end portions extending in the X direction are bent in the Y direction to overlap the through-wiring region TB. For example, the pad regions PAD refer to regions of the gate electrodes 130 overlapping the through-wiring regions TB. A single gate electrode 130 may have one or more pad regions PAD. The pad regions PAD may extend to the through-wiring region TB and may be connected to the contact plugs 180 in the through-wiring region TB.

As illustrated in FIG. 2, the gate electrodes 130 may be separated from adjacent gate electrodes 130 in the Y direction by a pair of first separation regions MS1 extending in the X direction. A gate electrode 130 between the pair of first separation regions MS1 may constitute a single memory block, but a range of the memory block is not limited thereto. A portion of the gate electrodes 130, for example, the gate electrodes constituting memory cells may form a single layer in a single memory block.

The gate electrodes 130 may include a metal material such as tungsten (W). In example embodiments, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN), titanium nitride (TiN), or combinations thereof.

The interlayer insulating layers 120 may be disposed between the gate electrodes 130. Similarly to the gate electrodes 130, the interlayer insulating layers 120 may be spaced apart from each other in a direction, perpendicular to the upper surface of the substrate 101, and may extend in the X direction. The interlayer insulating layers 120 may include an insulating material such as a silicon oxide or a silicon nitride.

The first and second separation regions MS1 and MS2 may be disposed to extend through the gate electrodes 130 in the first region A and the second region B in the X direction. The first and second separation regions MS1 and MS2 may be disposed parallel to each other. The first and second separation regions MS1 and MS2 may be connected to the substrate 101 through the entire gate electrodes 130 stacked on the substrate 101. The first separation regions MS1 extend along the first region A and the second region B as one region, and the second separation regions MS2 extend to only a portion of the second region B from the first region A or may be intermittently disposed in the first region A and the second region B. The first and second separation regions MS1 and MS2 may be disposed to not overlap the through-wiring region TB, and may be spaced apart from the through-wiring region TB. However, in example embodiments, the disposition order, number, and the like, of the first and second separation regions MS1 and MS2 are not limited to those illustrated in FIG. 2.

Figure 3C:
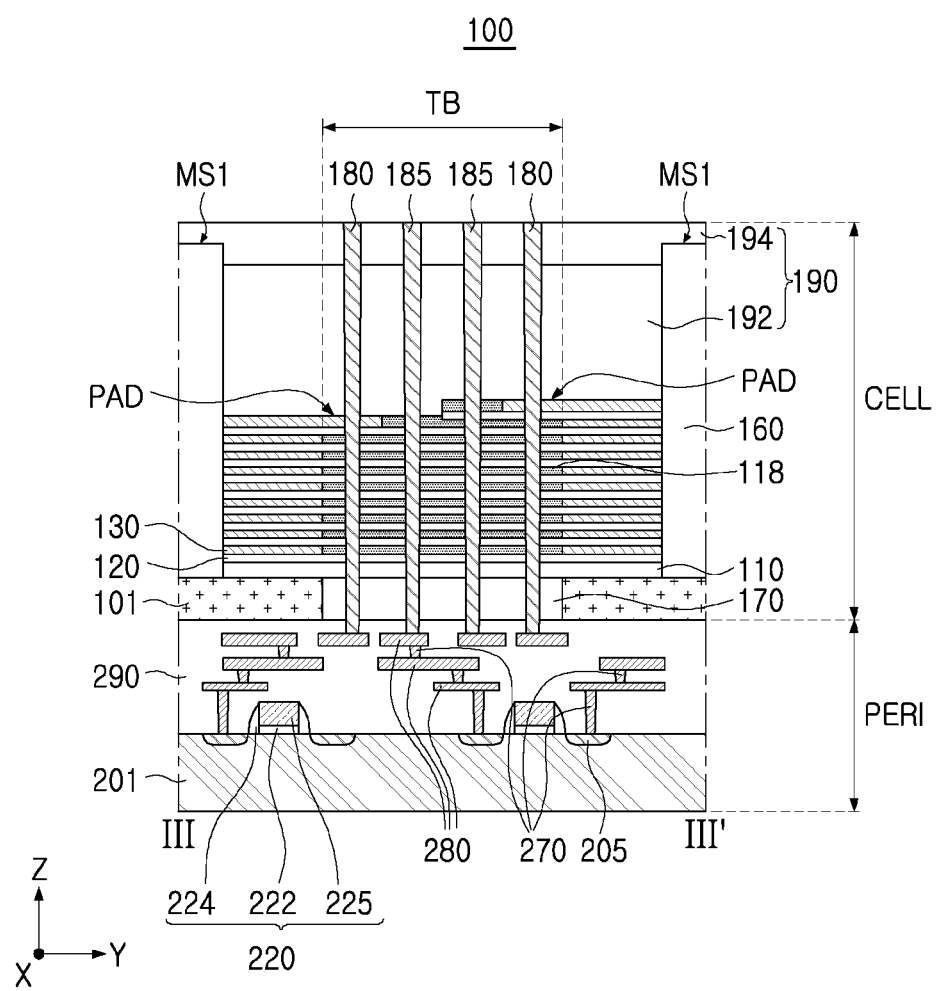
Figure 3D:
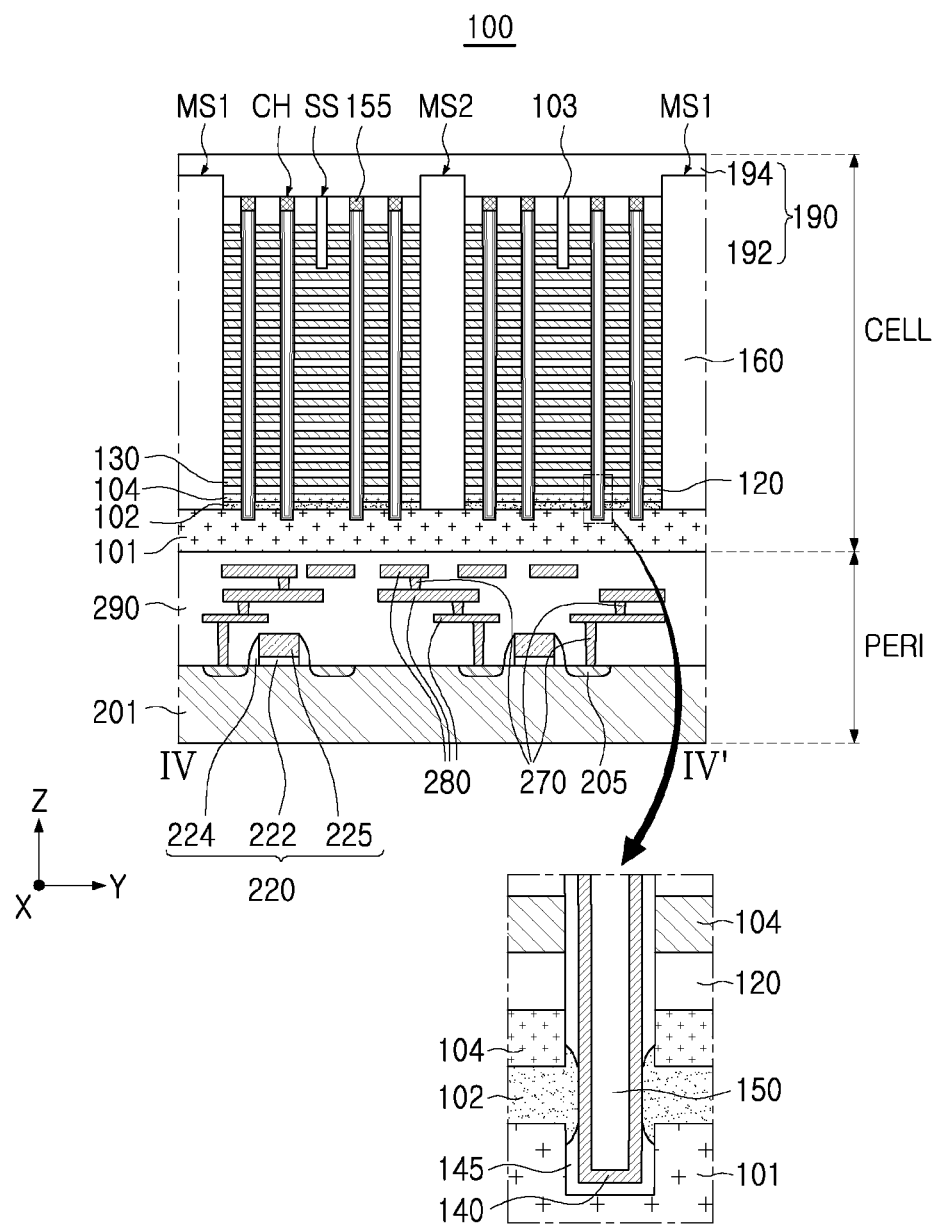

As illustrated in FIG. 3D, separation insulating layers 160 may be disposed in the first and second separation regions MS1 and MS2. In example embodiments, the separation insulating layer 160 may have a shape in which a width thereof is decreased in a direction toward the substrate 101 due to a high aspect ratio. However, in example embodiments, a conductive layer may be further disposed between the separation insulating layers 160 in the first and second separation regions MS1 and MS2. In this case, the conductive layer may function as a common source line of the semiconductor device 100 or a contact plug connected to a common source line.

The upper separation regions SS may extend in the X direction between the first separation regions MS1 and the second separation region MS2. The upper separation regions SS may be disposed in a portion of the second region B and the first region A to penetrate through a portion of gate electrodes 130 including an uppermost gate electrode 130 among the gate electrodes 130. As illustrated in FIG. 3D, the upper separation regions SS may separate three gate electrodes 130 from each other in the Y direction. However, the number of gate electrodes 130, separated by the upper separation regions SS, may vary according to example embodiments. The upper separation regions SS may include an upper separation insulating layer 103.

The channel structures CH may each constitute a single memory cell string, and may be spaced apart from each other in rows and columns on the first region A. The channel structures CH may be arranged to form a lattice form or may be arranged in a zigzag pattern in one direction. The channel structures CH may have a columnar shape, and may have an inclined side surface such that the width of the channel structure CH becomes narrower toward the substrate 101 depending on an aspect ratio. In example embodiments, dummy channels, substantially not constituting a memory cell string, may be further disposed on an end portion of the first region A adjacent to the second region B and the second region B. For example, the dummy channels may be arranged in the form described with reference to FIG. 9A below.

A channel layer 140 may be disposed in the channel structures CH. In the channel structures CH, the channel layer 140 may be formed to have an annular shape surrounding the channel insulating layer 150 therein. However, according to example embodiments, the channel layer 140 may have a columnar shape, such as a cylinder or a prism without the channel insulation layer 150. The channel layer 140 may be connected to a first horizontal conductive layer 102 at a lower portion. The channel layer 140 may include a semiconductor material such as polycrystalline silicon or single-crystalline silicon. The channel structures CH, disposed in a straight line in the Y direction between the first or second separation regions MS1 and MS2 and the upper separation region SS, may be connected to bitlines, different from each other, respectively, depending on an arrangement of the upper wiring structure connected to the channel pads 155. Although not illustrated, channel contact plugs may be disposed on the channel pads 155 to constitute the upper wiring structure.

The channel pads 155 may be disposed on the channel layer 140 in the channel structures CH. The channel pads 155 may be disposed to cover the top surface of the channel insulating layer 150 and to be electrically connected to the channel layer 140. The channel pads 155 may include, for example, doped polycrystalline silicon.

A gate dielectric layer 145 may be disposed between the gate electrodes 130 and the channel layer 140. Although not specifically illustrated, the gate dielectric layer 145 may include a tunneling layer, an electric charge storage layer, and a blocking layer, which are sequentially stacked from the channel layer 140. The tunneling layer may tunnel electric charges to the electric charge storage layer and may include, for example, silicon oxide ($SiO_2$), silicon nitride ($Si_3N_4$), silicon oxynitride (SiON), or combinations thereof. The electric charge storage layer may be an electric charge trapping layer or a floating gate conductive layer. The blocking layer may include, e.g., silicon oxide ($SiO_2$), silicon nitride ($Si_3N_4$), silicon oxynitride (SiON), a high-k dielectric material, or combinations thereof. In example embodiments, at least a portion of the gate dielectric layer 145 may extend along the gate electrodes 130 in a horizontal direction.

First and second horizontal conductive layers 102 and 104 may be stacked on the upper surface of the substrate 101. At least a portion of the first and second horizontal conductive layers 102 and 104 may function as a portion of a common source line of the semiconductor device 100, and may function as a common source line together with the substrate 101. As illustrated in an enlarged view of FIG. 3D, the first horizontal conductive layer 102 may be directly connected to the channel layer 140 around the channel layer 140. The first and second horizontal conductive layers 102 and 104 may include a semiconductor material, for example, polycrystalline silicon. In this case, at least the first horizontal conductive layer 102 may be a doped layer, and the second horizontal conductive layer 104 may be a doped layer or a layer including impurities diffused from the first horizontal conductive layer 102.

A horizontal insulating layer 110 may be disposed in a region in which the first and second horizontal conductive layers 102 and 104 are removed in the second region B of the substrate 101. The horizontal insulating layer 110 may be formed of an insulating material and may include, for example, a silicon oxide, a silicon oxynitride, or a silicon nitride. In example embodiments, the horizontal insulating layer 110 may be omitted.

A cell region insulating layer 190 may be disposed to cover the substrate 101, the gate electrodes 130 on the substrate 101, and a peripheral region insulating layer 290. The cell region insulating layer 190 may include first and second cell region insulating layers 192 and 194, and each of the first and second cell region insulating layers 192 and 194 may also include a plurality of insulating layers. The cell region insulating layer 190 may be formed of an insulating material.

A through-wiring region TB may be a region corresponding to the first through-wiring region TB1 of FIG. 1, and may be a region including a wiring structure for electrically connecting the memory cell region CELL and the peripheral circuit region PERI (e.g., the row decoder DEC) to each other. The through-wiring region TB may include contact plugs 180 and through-vias 185 extending from above through the substrate 101 in a Z direction, and interlayer insulating layers 120 and sacrificial insulating layers 118 surrounding the contact plugs 180 and the through-vias 185 and constituting an insulating region. The through-wiring region TB may have slit regions SL disposed to be in contact with (e.g., directly adjacent to) the pad regions PAD of the gate electrodes 130. The through-wiring regions TB may be disposed in the second region B, for example, one through-wring region TB may be disposed for each of one or more memory blocks. However, the size, arrangement, and shape of the through-wiring region TB, illustrated in FIG. 2, may vary according to example embodiments.

The through-wiring region TB may be spaced apart from the first and second separation regions MS1 and MS2. For example, the through-wiring region TB may be disposed in a center of a pair of adjacent first separation regions MS1 in the Y direction. Such an arrangement may allow the sacrificial insulating layers 118 to remain in the through-wiring region TB, which will be described later in further detail with reference to FIGS. 16A and 16B. Accordingly, except for the pad regions PAD, the gate electrodes 130 may not extend to the through-wiring region TB.

The sacrificial insulating layers 118, constituting the insulating region of the through-wiring region TB, may be disposed to have the same thickness at the same height level as the gate electrodes 130, and may have side surfaces disposed to be in contact with the gate electrodes 130 on the boundary of the through-wiring region TB. The sacrificial insulating layers 118 may be stacked alternately with the interlayer insulating layers 120 to constitute the insulating region. The sacrificial insulating layers 118 may be formed of an insulating material different from the material of the interlayer insulating layers 120 and may include, for example, a silicon oxide, a silicon nitride, or a silicon oxynitride. A shape of the sacrificial insulating layers 118, constituting a boundary of the through-wiring region TB of FIG. 2, may vary according to example embodiments.

The contact plugs 180 of the through-wiring region TB may extend in a direction, perpendicular to the upper surface of the substrate 101, through the cell region insulating layer 190, the pad regions PAD of the gate electrodes 130, the insulating region of the through-wiring region TB, the substrate 101, and a portion of the peripheral area insulating layer 290. The contact plugs 180 may be connected to the circuit wiring lines 280 at a lower portion thereof. The contact plugs 180 may electrically connect the gate electrodes 130 and the circuit elements 220 of the peripheral circuit region PERI to each other. In particular, each of the contact plugs 180 may be connected to the gate electrode 130 in the pad region PAD through the pad region PAD of the gate electrode 130 in an uppermost portion of the stacked structure of the gate electrodes 130 and may penetrate through sacrificial insulating layers 118 and interlayer insulating layers 120 constituting the insulating region disposed therebelow, as illustrated in FIGS. 3A and 3C. Thus, a single contact plug 180 may be physically and electrically connected to the pad region PAD of one gate electrode 130. However, for example, when the gate electrodes 130 do not have a stepped structure in the Y direction, the plurality of contact plugs 180 may be connected to a plurality of pad regions PAD of a single gate electrode 130, in example embodiments.

Among the contact plugs 180, contact plugs 180 disposed on an external side of the through-wiring region TB may be connected to a portion of the gate electrodes 130 including the uppermost gate electrode 130 and may be disposed so as not to penetrate through the gate electrodes 130.

The through-vias 185 penetrate through portions of the cell region insulating layer 190, the insulating region of the through-wiring region TB, the substrate 101, and the peripheral region insulating layer 290 from above to extend to the substrate 101 in a direction perpendicular to the upper surface of the substrate 101. Unlike the contact plugs 180, the through-vias 185 may not be connected to the gate electrodes 130 and may extend downwardly through only the insulating region of the through-wiring region TB. The through-vias 185 may be connected to the circuit wiring lines 280 in a lower portion thereof. The through-vias 185 may electrically connect overlying wiring lines, not illustrated, and the circuit elements 220 of the peripheral circuit region PERI to each other. For example, the wiring lines may be electrically connected to a portion of the gate electrodes 130 or the channel layers 140 of the channel structures CH. The number, arrangement, and shape of the contact plugs 180 and the through-vias 185 in a single through-wiring region TB may vary according to example embodiments. The contact plugs 180 and the through-vias 185 may include a conductive material, for example, tungsten (W), copper (Cu), aluminum (Al), or the like.

The slit regions SL may be disposed on one side of the pad regions PAD of the gate electrodes 130. For example, the slit regions SL may be disposed to be in contact with (e.g., directly adjacent to) an internal side surface, close to the first region A, among opposite side surfaces of the pad regions PAD in the X direction. The slit regions SL may function to control etching during a process of forming the pad regions PAD to define internal boundaries of the pad regions PAD, and thus, adjacent pad regions PAD may be formed to be spaced apart from each other. This will be described later in further detail with reference to FIGS. 16A and 16B.

The slit regions SL may be insulating regions. As illustrated in FIG. 3A, the slit regions SL may include regions in which a portion of the insulating region of the through-wiring region TB is removed from an upper surface thereof. As illustrated in FIGS. 2 and 3A, each of the slit regions SL may be disposed on the left side of the pad region PAD such that the pad region PAD is spaced apart from the sacrificial insulating layer 118 having the same level. The slit region SL may be disposed to penetrate through the sacrificial insulating layer 118 having the same level as the pad region PAD and to expose the interlayer insulating layer 120 disposed therebelow. A side end portion of the slit regions SL in the X direction, for example, a left end portion of the drawing, may be aligned in a line in the Z direction with a right end portion of adjacent left gate electrodes 130. For example, the slit regions SL may have end portions disposed below in a straight line with end portions of the gate electrodes 130 extending to the same length. Since the slit regions SL may prevent the pad region PAD from extending in the X direction, physical separation between the pad regions PAD disposed adjacent to each other in the X direction may be secured. In example embodiments, the slit regions SL may be disposed on one side of only a portion of the pad regions PAD of the gate electrodes 130. For example, the slit regions SL may not be disposed on one side of an uppermost pad region PAD among the pad regions PAD of the gate electrodes 130.

The slit regions SL may be filled with the cell region insulating layer 190, and the cell region insulating layer 190 may be in contact with the exposed interlayer insulating layers 120 in the slit regions SL. Accordingly, both side surfaces of the pad regions PAD in the x direction may be completely covered with the cell region insulating layer 190. The cell region insulating layer 190 may include a material different from a material of the sacrificial insulating layers 118, and thus, boundaries between the cell region insulating layer 190 in the slit regions SL and the sacrificial insulating layers 118, disposed to be in contact therewith, may be separated from each other.

As illustrated in the enlarged view of FIG. 2, the slit region SL has a first length L1 in the X direction and a second length L2, greater than the first length L1, in the Y direction. Therefore, the slit region SL may have a rectangular or elliptical shape extending in the Y direction. At least a portion of a right side surface of the slit region SL may be in contact with (e.g., directly adjacent to) the pad region PAD. The pad region PAD may have a third length L3 in the X direction and a fourth length L4 in the Y direction. The fourth length L4 may be greater than the third length L3, but is not limited thereto. For example, the second length L2 of the slit region SL may be about 80% or more of the fourth length L4 of the pad region PAD. As a result, the slit regions SL may allow the pad regions PAD to be stably spaced apart from each other. In addition, the first length L1 of the slit region SL may range from about 30 nm to about 130 nm, for example. When the first length L1 is less than the range, it may be difficult to perform a formation process. When the first length L1 is greater than the range, it may be difficult to secure a size of the pad region PAD.

In example embodiments, only one slit region SL is disposed at a boundary between two pad regions PAD. Each of the slit regions SL may vertically pass through the end side of a corresponding pad of the pad regions PAD and contact the edge of the corresponding pad. The slit regions SL (e.g., between two adjacent slit regions SL at the same Y-direction location) may be disposed parallel to each other in the X direction. The X direction distances L3 between the slit regions SL may be substantially the same.

The peripheral circuit region PERI may include a base substrate 201, circuit elements 220 disposed on the base substrate 201, circuit contact plugs 270, and circuit wiring lines 280.

The base substrate 201 may have an upper surface extending in the X direction and the Y direction. In the base substrate 201, additional device isolation layers may be formed to define an active region. Source/drain regions 205 including impurities may be disposed in a portion of the active region. The base substrate 201 may include a semiconductor material, such as a group IV semiconductor, a group III-V compound semiconductor, or a group II-VI compound semiconductor.

The circuit elements 220 may include a planar transistor. Each of the circuit elements 220 may include a circuit gate dielectric layer 222, spacer layers 224, and a circuit gate electrode 225. Source/drain regions 205 may be formed in the base substrate 201 on opposite sides adjacent to the circuit gate electrode 225.

A peripheral region insulating layer 290 may be disposed on the circuit element 220 on the base substrate 201. The circuit contact plugs 270 may be connected to the source/drain regions 205 through the peripheral region insulating layer 290. Electrical signals may be applied to the circuit device 220 by the circuit contact plugs 270. In a region not illustrated, the circuit contact plugs 270 may also be connected to the circuit gate electrode 225. The circuit wiring lines 280 may be connected to the circuit contact plugs 270 and may be disposed as a plurality of layers. An uppermost circuit wiring lines 280 may be directly connected to the contact plugs 180 and the through-vias 185 in the through-wiring region TB.

According to example embodiments, the peripheral circuit region PERI may be disposed on the substrate 101 together with the memory cell region CELL on one side of the memory cell region CELL. In this case, the gate electrodes 130 of the memory cell region CELL may be bent and extend upwardly of the circuit elements 220 of the peripheral circuit region PERI, and the above description may be equally applied to the other contents.

Figure 4:
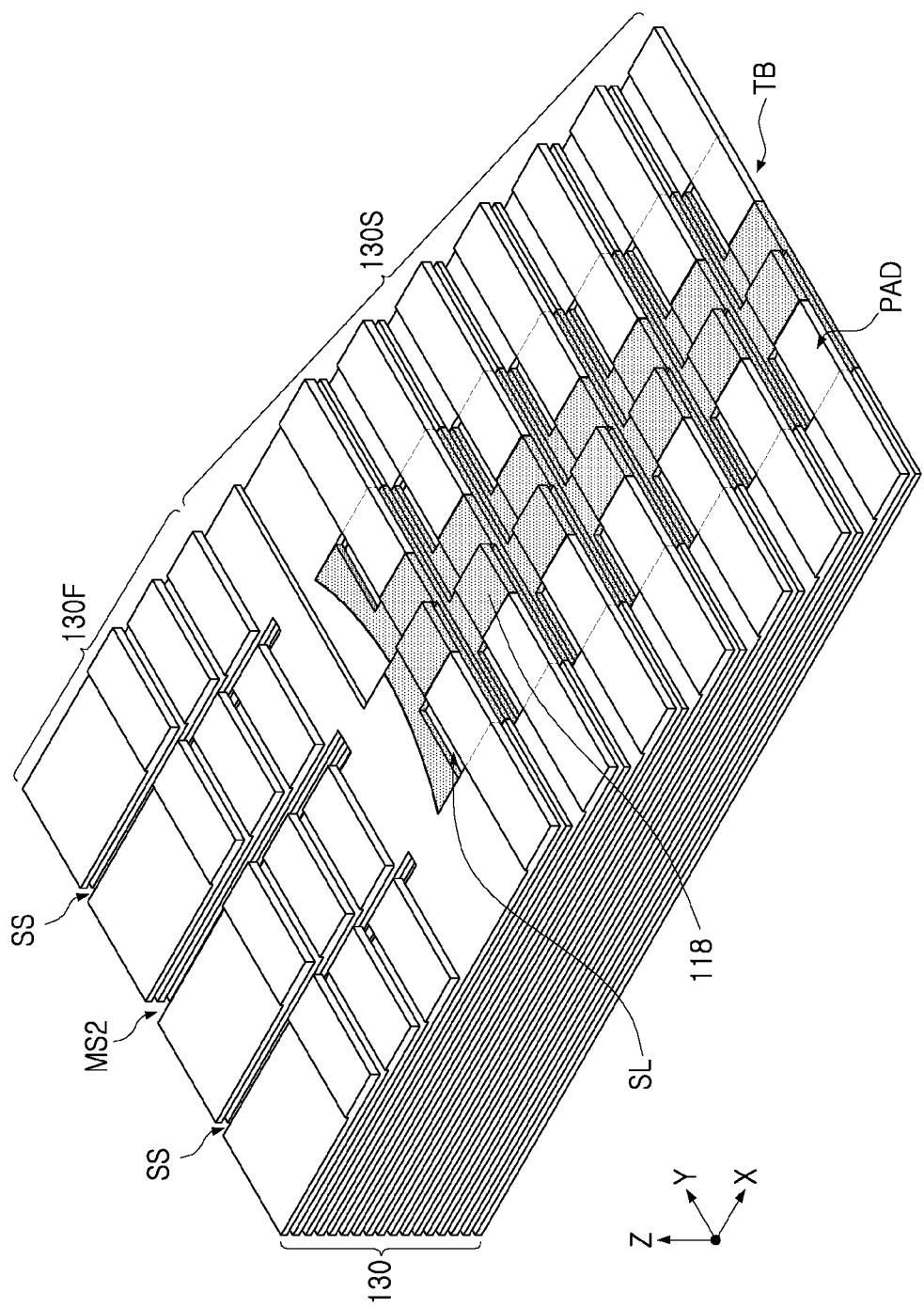
FIG. 4 is a perspective view of elements, including gate electrodes, of a semiconductor device according to example embodiments.

FIG. 4 is a perspective view of elements, including gate electrodes, of a semiconductor device according to example embodiments.

Figure 5:
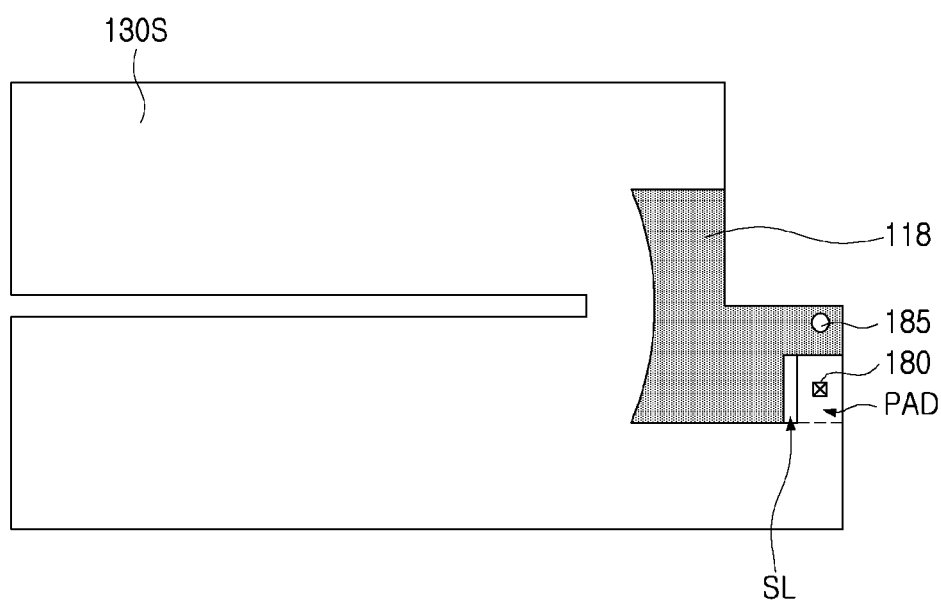
FIG. 5 is a plan view including one gate electrode of a semiconductor device according to example embodiments.

FIG. 5 is a plan view including one gate electrode of a semiconductor device according to example embodiments.

Referring to FIG. 4, a stacked structure of gate electrodes 130 and sacrificial insulating layers 118 between a pair of first separation regions MS1 (see FIG. 2) is illustrated. Among the gate electrodes 130, upper gate electrodes 130F may be separated by the first and second separation regions MS1 and MS2 and the upper separation regions SS, so that each of upper gate electrodes 130F may include four layers at the same level. The lower gate electrodes 130S may each include a single layer and may form a stepped structure in the X direction and the Y direction. However, according to example embodiments, the lowermost gate electrode 130 may not form a stepped structure with the upper gate electrode 130 in the Y direction.

The lower gate electrodes 130S may have pad regions PAD bent on an end portion thereof in the Y direction to extend inwardly of the through-wiring region TB. The pad regions PAD of the lower gate electrodes 130S may be in a state in which they are exposed upwardly in an upper portion of the stacked structure, and the sacrificial insulating layers 118, constituting an insulation region of the through-wiring region TB, may be in a state in which they are stacked below the pad regions PAD.

The slit regions SL may be disposed to penetrate through at least uppermost sacrificial insulating layers 118 on internal sides of the pad regions PAD. The slit regions SL may be disposed between the pad regions PAD adjacent to each other in the X direction.

Referring to FIG. 5, a plane including a single lower gate electrode 130S is illustrated. The lower gate electrode 130S may be disposed to be in contact with the sacrificial insulating layer 118, having the same level as the lower gate electrode 130S and constituting a through-wiring region TB, and may be spaced apart from the sacrificial insulating layer 118 on an internal side of the pad region PAD by a slit region SL. The contact plug 180 may be disposed to penetrate through the pad region PAD, and the through-via 185 may be disposed to penetrate through the sacrificial insulating layer 118.

Figure 6A:
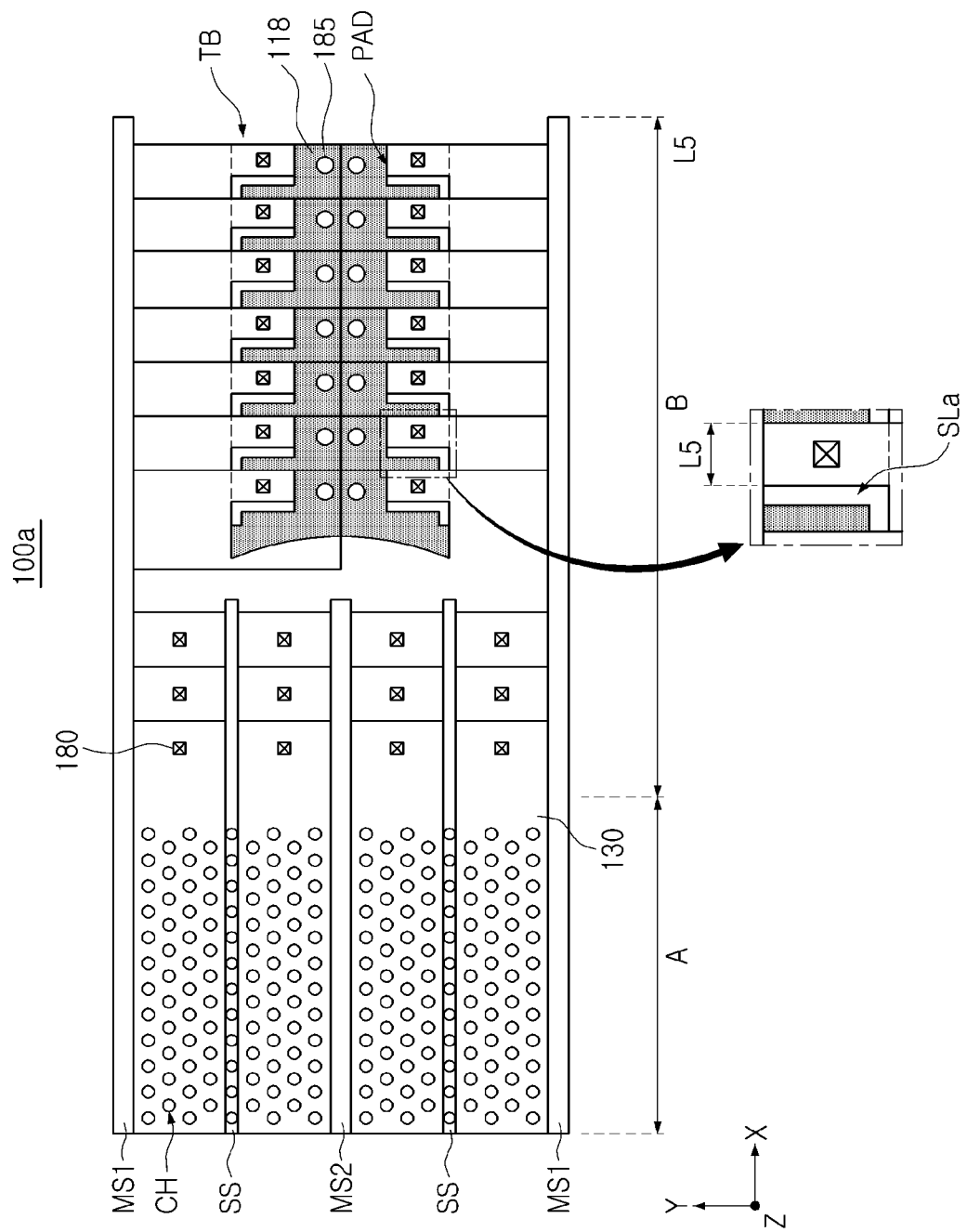
FIGS. 6A and 6B are plan views of a semiconductor device according to example embodiments.
Figure 6B:
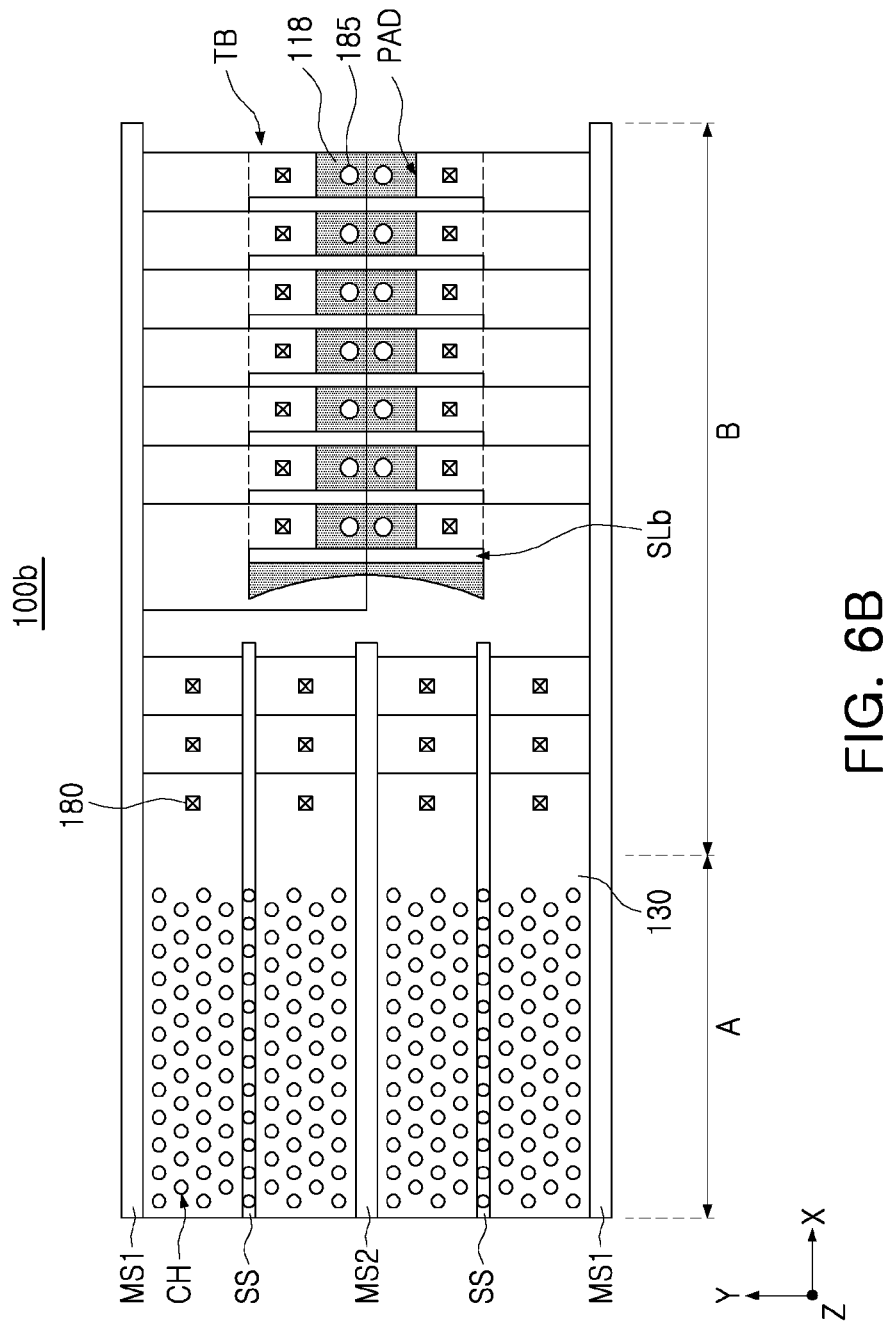

FIGS. 6A and 6B are plan views of a semiconductor device according to example embodiments.

Referring to FIG. 6A, in a semiconductor device 100a, slit regions SLa may have a shape bent from internal side surfaces of pad regions PAD along end portions of gate electrodes 130 at one side of the pad regions PAD. For example, the slit regions SLa may have an 'L' shape. Accordingly, a sacrificial insulating layer 118 and a slit region SLa may be disposed between two pad regions PAD adjacent to each other in an X direction. However, in example embodiments, a shape of the slit regions SLa is not limited thereto. For example, the slit regions SLa may have various shapes such as a triangle, which is in contact with (e.g., directly adjacent to) the internal side surfaces of the pad regions PAD and the end portions of the gate electrodes 130 in a Y direction, and the like.

Referring to FIG. 6B, in a semiconductor device 100b, the slit regions SLb may extend relatively long in a Y direction in a through-wiring region TB. Specifically, the respective slit regions SLb may extend into one to be in contact with (e.g., directly adjacent to) the plurality of pad regions PAD disposed side by side in the Y direction. As described above, according to example embodiments, a length of the slit regions SLb in the Y direction may be greater than a length of the pad regions PAD in the Y direction.

Figure 7A:
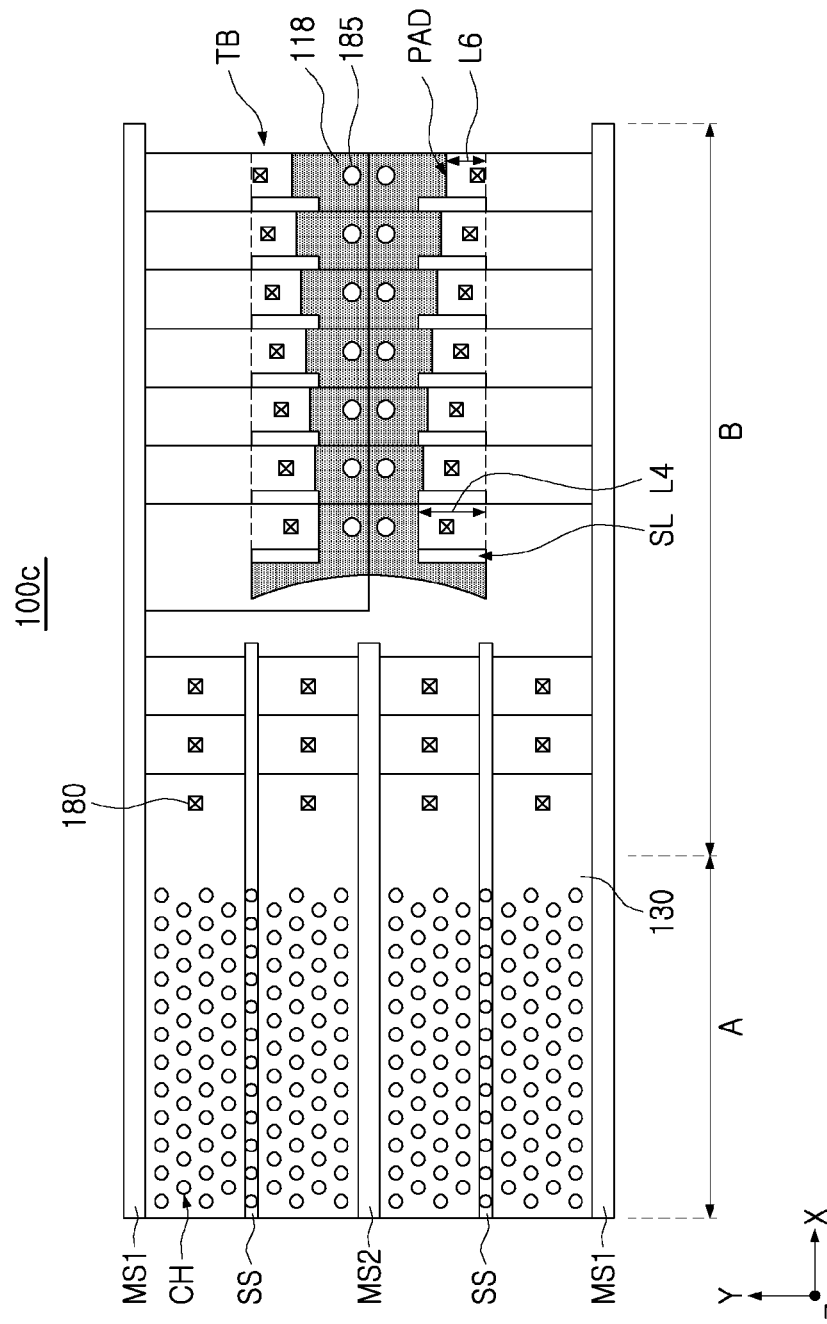
FIGS. 7A and 7B are plan views of a semiconductor device according to example embodiments.
Figure 7B:
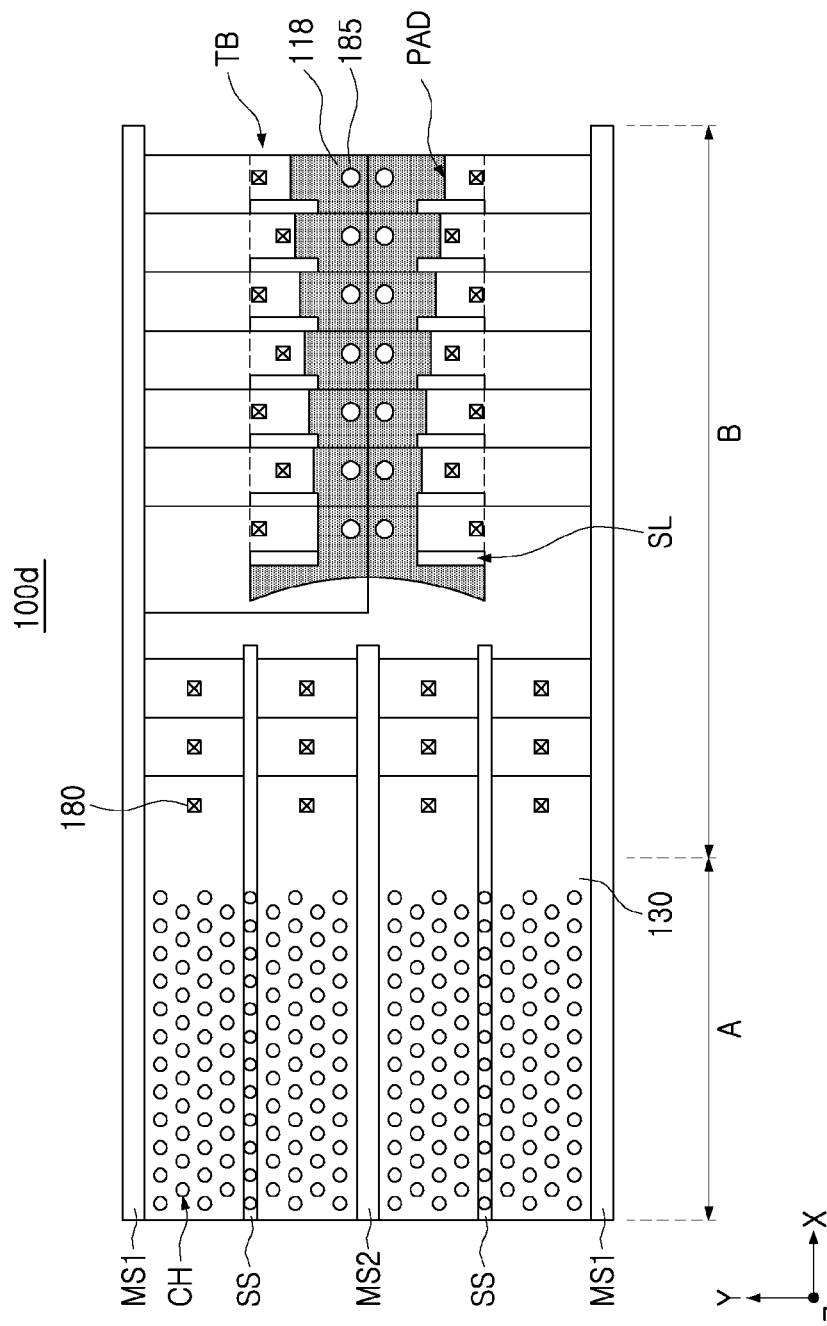

FIGS. 7A and 7B are plan views of a semiconductor device according to example embodiments.

Referring to FIG. 7A, in a semiconductor device 100c, pad regions PAD may have different lengths in a Y direction, and lengths protruding to a through-wiring region TB, for example, lengths overlapped the through-wiring region TB may be different from each other. For example, the lengths of the pad regions PAD may be decreased in a direction distant from the first region A, as illustrated in FIG. 7A. The pad region PAD, closest to the first region A, may have a fourth length L4 in the Y direction, and the pad region PAD, farthest from the first region A, may have a sixth length L6, shorter than four lengths L4, in the Y direction. The contact plugs 180 may be spaced apart from each other by a predetermined distance from an end portion of each of pad region PAD in the Y direction.

Referring to FIG. 7B, in a semiconductor device 100d, pad regions PAD may have the same shape as described in the example embodiment of FIG. 7A, but an arrangement of the contact plugs 180 may be different from the arrangement described in FIG. 7A. Contact plugs 180 may be arranged in a zigzag pattern in an X direction in the pad regions PAD. However, according to example embodiments, the contact plugs 180 may be arranged on a straight line in the X direction.

Figure 8A:
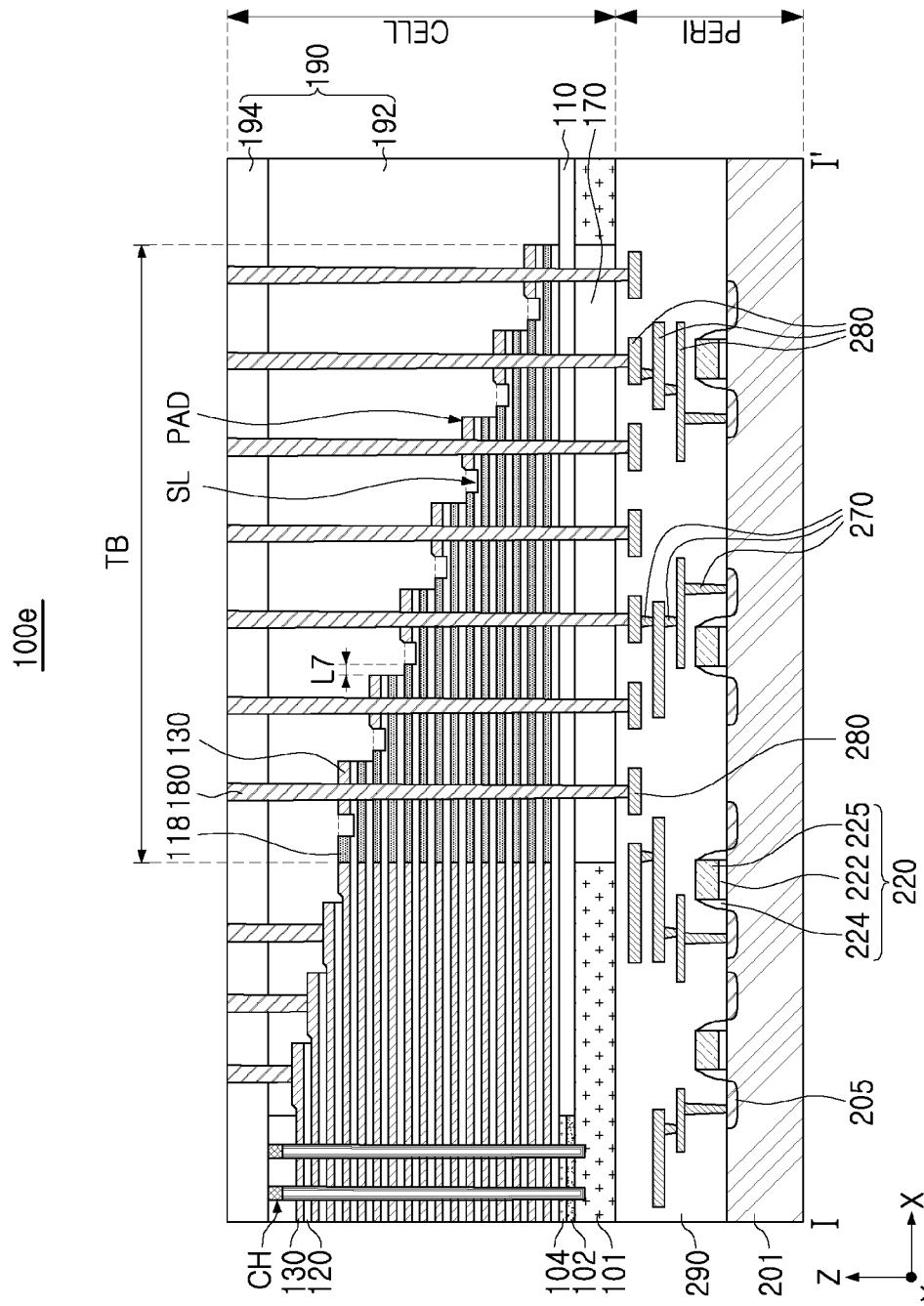
FIGS. 8A to 8C are cross-sectional views of a semiconductor device according to example embodiments.
Figure 8B:
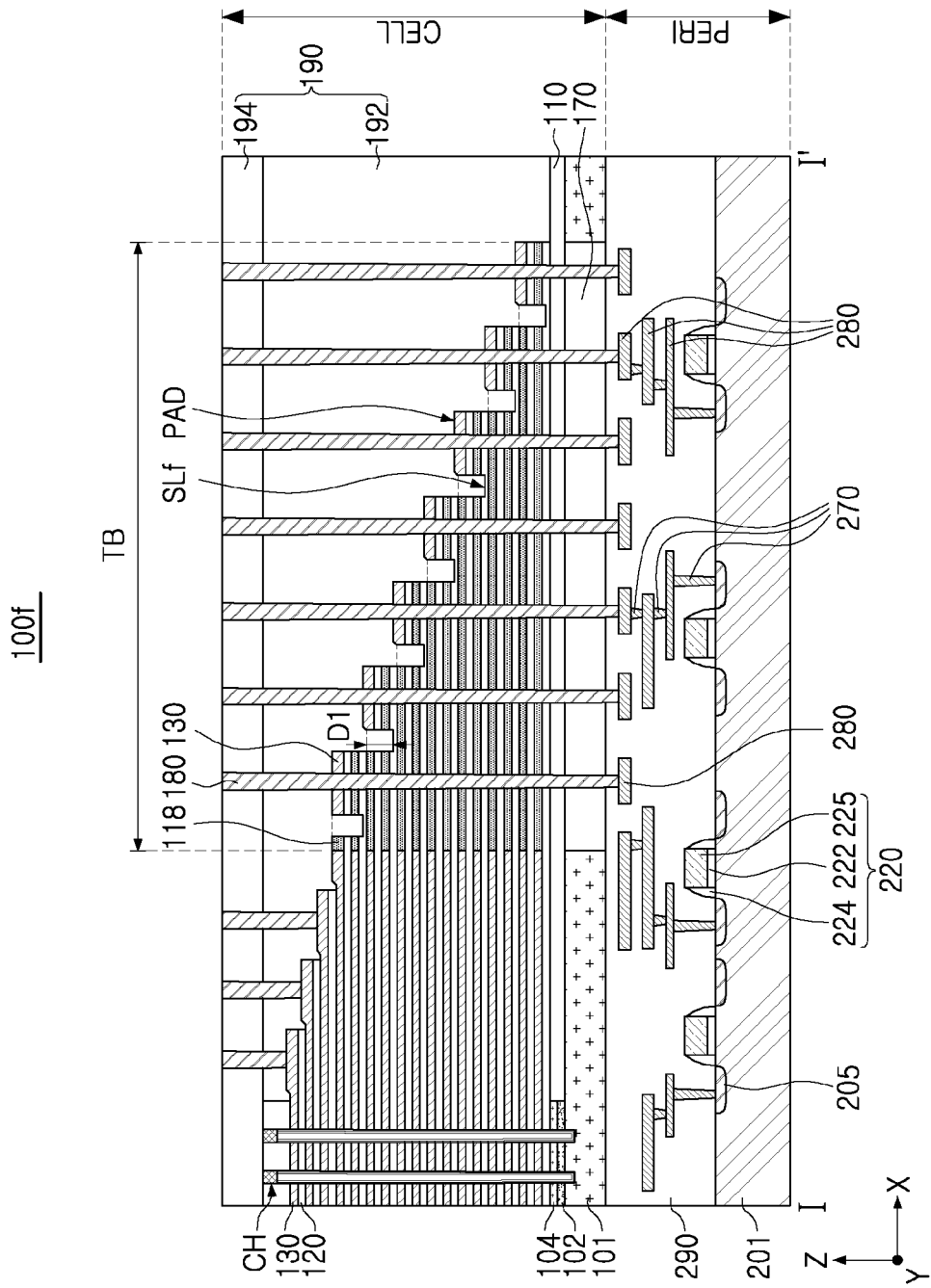
Figure 8C:
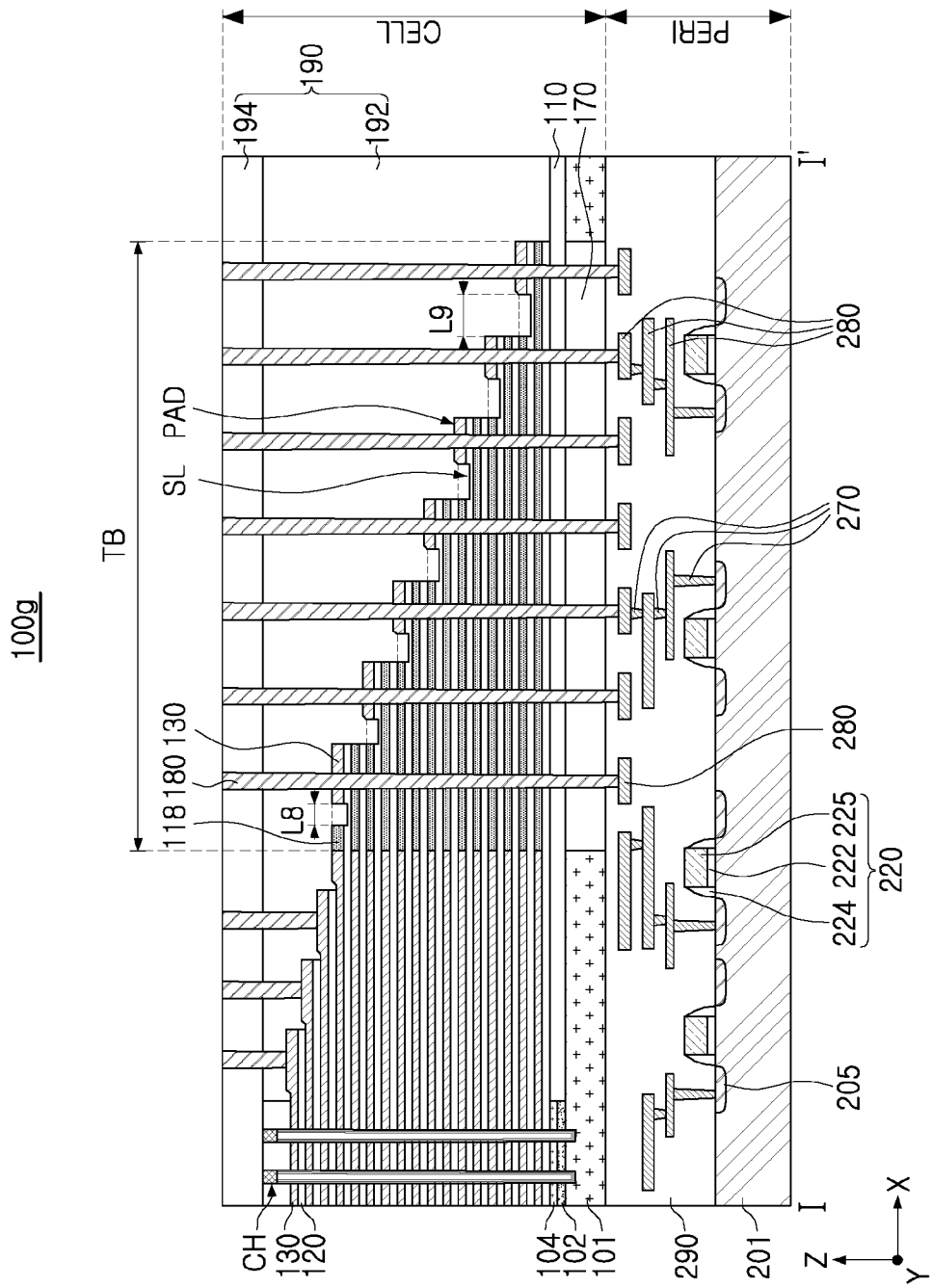

FIGS. 8A to 8C are cross-sectional views of a semiconductor device according to example embodiments. Each of FIGS. 8A to 8C illustrates a cross section corresponding to FIG. 3A.

Referring to FIG. 8A, in a semiconductor device 100e, one end portion of slit regions SL in an X direction, for example, a left end portion of the drawing, may be disposed by being shifted from a right end portion of adjacent left gate electrodes 130 in an X direction. Accordingly, a sacrificial insulating layer 118 and the slit region SL may be disposed between two pad regions PAD adjacent to each other in the X direction. A length L7, shifted from the end portions of the gate electrodes 130 adjacent to the slit regions SL, may vary within a range, capable of securing widths of the pad regions PAD.

Referring to FIG. 8B, in a semiconductor device 100f, a depth D1, at which slit regions SL are recessed from an upper surface of sacrificial insulating layers 118 and interlayer insulating layers 120 of a stacked structure in a Z direction, may be different from that in the example embodiment of FIG. 3A. Each of the slit regions SL may be disposed to penetrate through the two sacrificial insulating layers 118 and the interlayer insulating layer 120 therebetween to expose an underlying interlayer insulating layer 120. For example, each of the slit regions SL may be disposed between two pad regions including an upper pad region and a lower pad region disposed at a different level from each other. As described above, extension depths of the slit regions SL may vary according to example embodiments. In addition, the extension depths of the slit regions SL may be different from each other among the slit regions SL.

Referring to FIG. 8C, in a semiconductor device 100g, slit regions SL may have different lengths to each other in an X direction. For example, the length of the slit region SL in the X direction may be increased in a direction distant from a first region A. The slit region SL, closest to the first region A, may have an eighth length L8 in the X direction and the slit region SL, farthest from the first region A, may have a ninth length L9, greater than the eighth length L8, in the X direction. The length of the slit regions SL in the X direction may vary according to example embodiment. In example embodiments, lengths of the slit regions SL may vary together with depths as in the example embodiment of FIG. 8B. As described above, in example embodiments, shapes including the lengths and the depths of the slit regions SL may be different from each other between the slit regions SL.

Figure 9A:
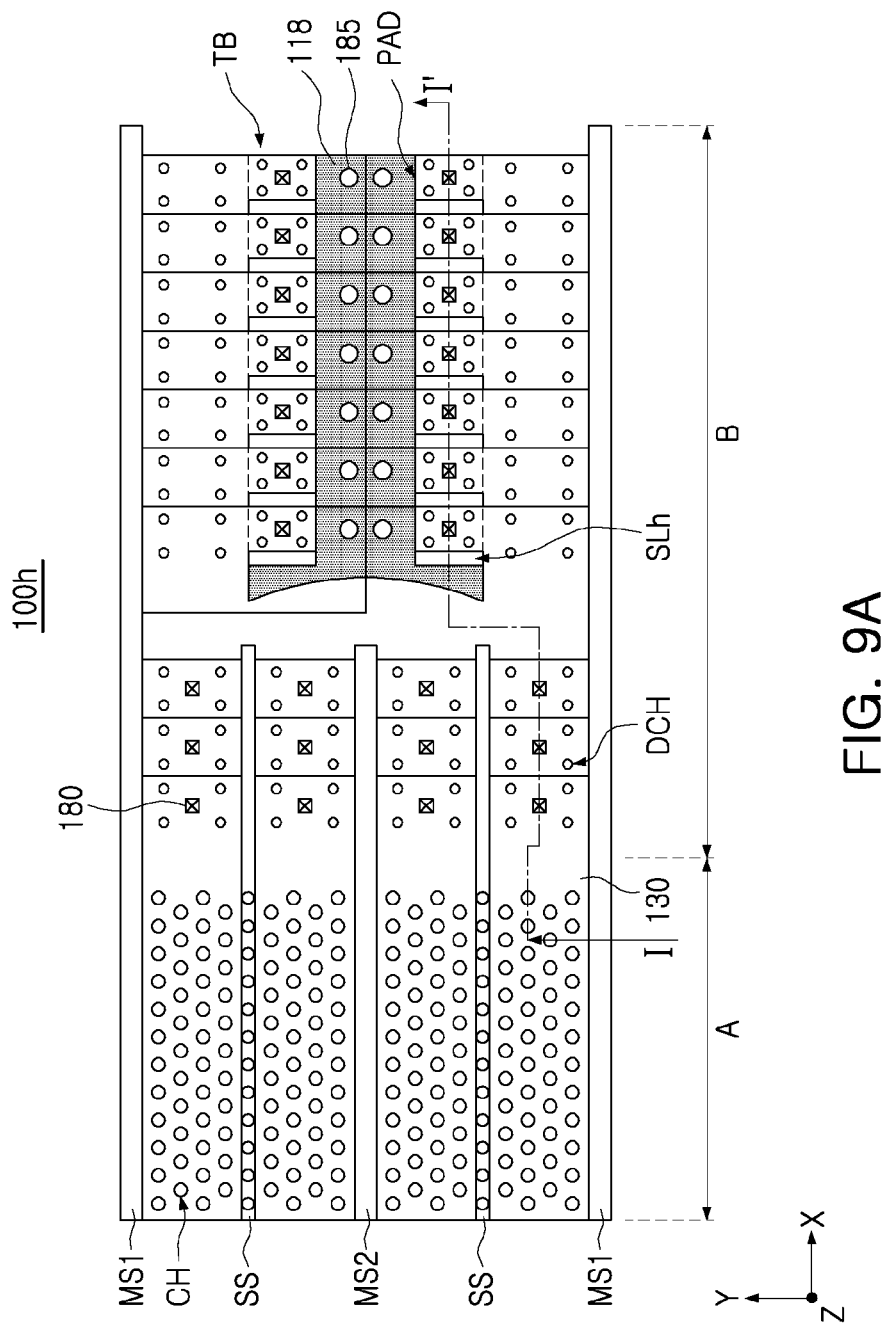
FIGS. 9A and 9B are a schematic plan view and a schematic cross-sectional view of a semiconductor device according to example embodiments, respectively.
Figure 9B:
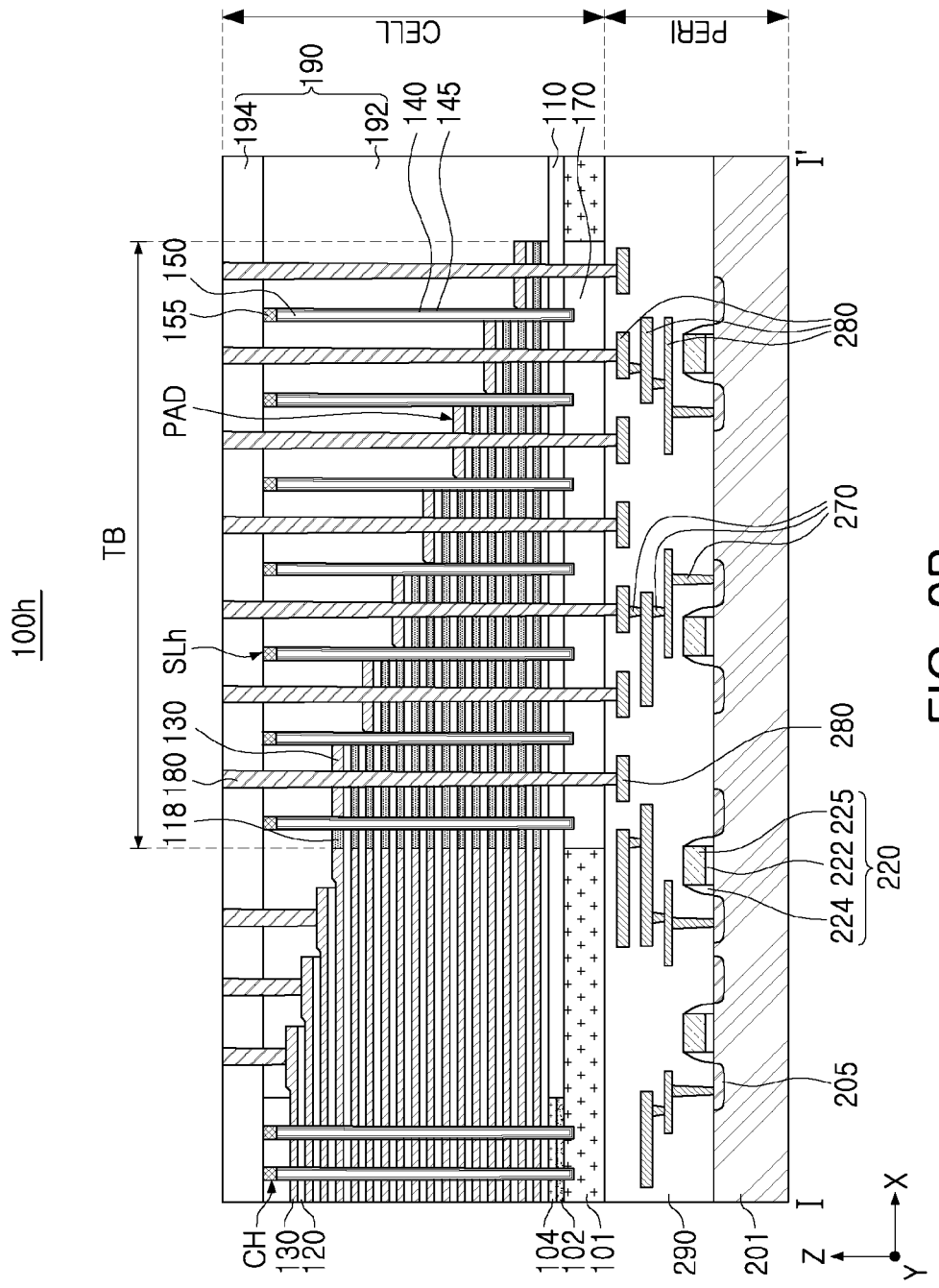

FIGS. 9A and 9B are a schematic plan view and a schematic cross-sectional view of a semiconductor device according to example embodiments, respectively. FIG. 9B illustrates a cross section taken along line I-I' in FIG. 9A.

Referring to FIGS. 9A and 9B, a semiconductor device 100h may further include dummy channel structures DCH disposed in a memory cell region CELL and a through-wiring region TB. The dummy channel structures DCH may be regularly disposed in a second region B and the through-wiring region TB of the substrate 101. The dummy channel structures DCH may have the same internal structure as channel structures CH, and may have the same or different size and shape as the channel structures CH. The dummy channel structures DCH may be disposed to penetrate through at least one gate electrode 130. However, in example embodiments, the dummy channel structures DCH may be further provided in the through-wiring region TB to penetrate through sacrificial insulating layers 118 and interlayer insulating layers 120. In example embodiments, dummy channel structures DCH disposed by four to surround the contact plugs 180 may be omitted in the through-wiring region TB. In this case, a process margin during formation of the contact plugs 180 may be further secured.

In this embodiment, slit regions SLh may have the same structure as the dummy channel structures DCH. Accordingly, each of the slit regions SLh may include a channel layer 140, a gate dielectric layer 145, a channel insulating layer 150, and a channel pad 155 provided therein. The slit regions SLh may be disposed to extend from an upper surface of a first cell region insulating layer 192 to a substrate 101, similarly to the dummy channel structures DCH. However, as illustrated in FIG. 9A, since the slit regions SLh have a shape extending along one side of the pad regions PAD, they may have a shape different from a shape of the dummy channel structures DCH, when viewed from above.

Figure 10:
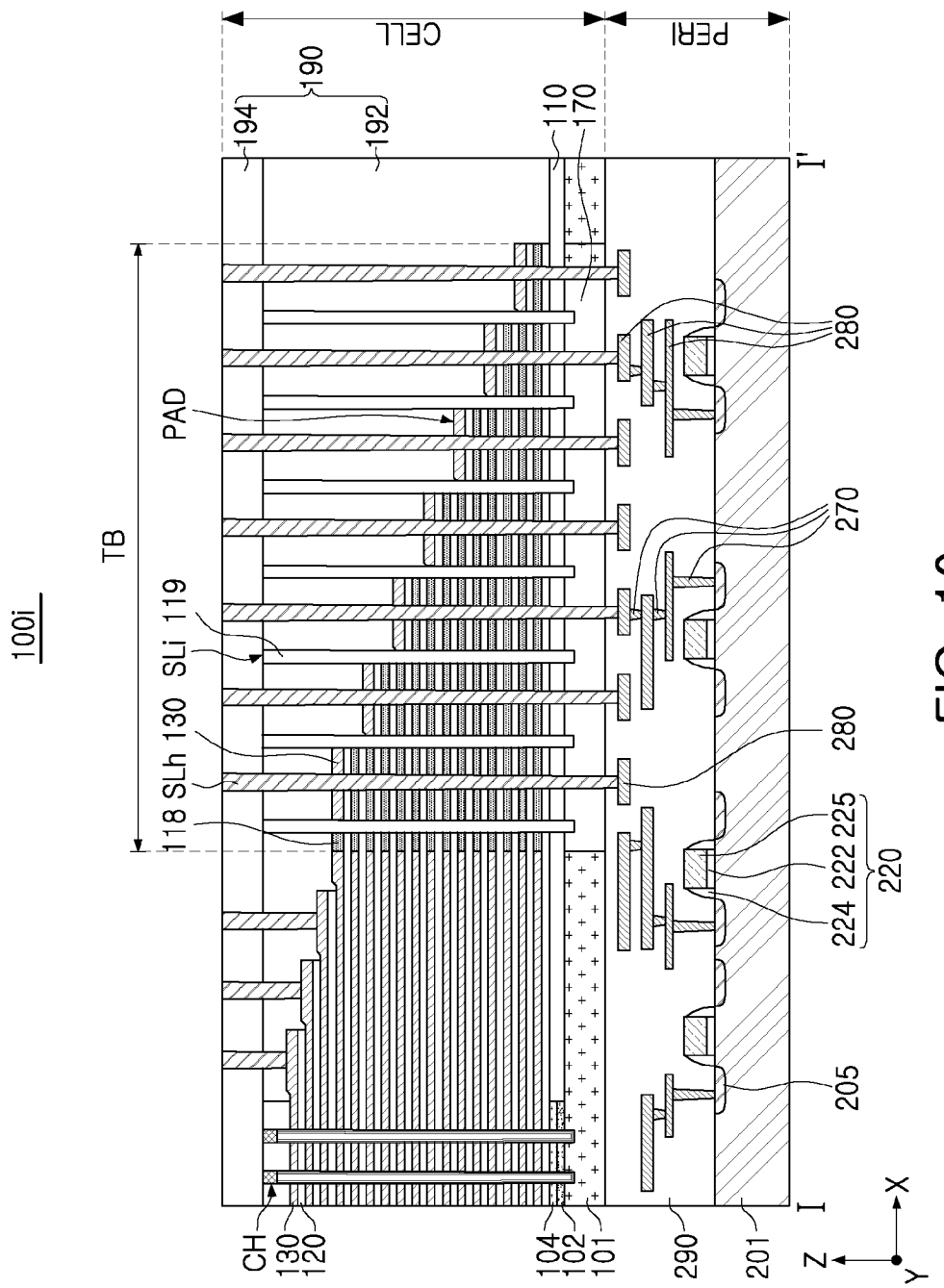
FIG. 10 is a cross-sectional view of a semiconductor device according to example embodiments.

FIG. 10 is a cross-sectional view of a semiconductor device according to example embodiments. FIG. 10 illustrates a cross section corresponding to FIG. 3A.

Referring to FIG. 10, in a semiconductor device 100i, slit regions SLi may be disposed to extend to a substrate 101, similarly to the embodiment of FIG. 9B. Unlike the embodiment of FIG. 9B, the slit regions SLi do not have the same structure as a channel structure CH and a dummy channel structure DCH, and may include a columnar slit insulating layer 119. In this embodiment, a support structure including an insulating layer, similarly to the slit regions SLi, may be further provided in a second region B, but the present disclosure is not limited thereto. Additionally, in example embodiments, heights of upper surfaces of the slit insulating layers 119 may be different from heights of upper surfaces of the channel structures CH.

Figure 11A:
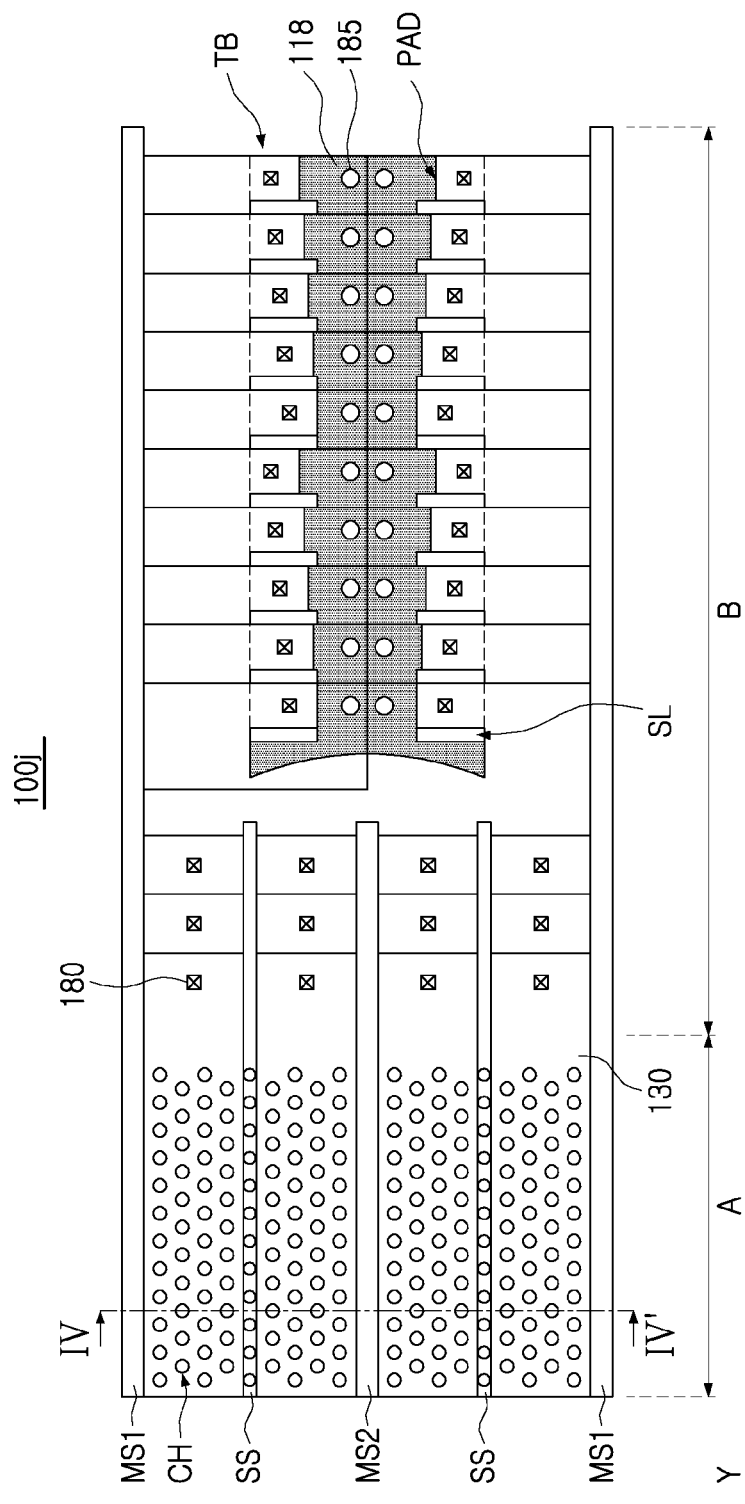
FIGS. 11A and 11B are a schematic plan view and a schematic cross-sectional view of a semiconductor device according to example embodiments, respectively.
Figure 11B:
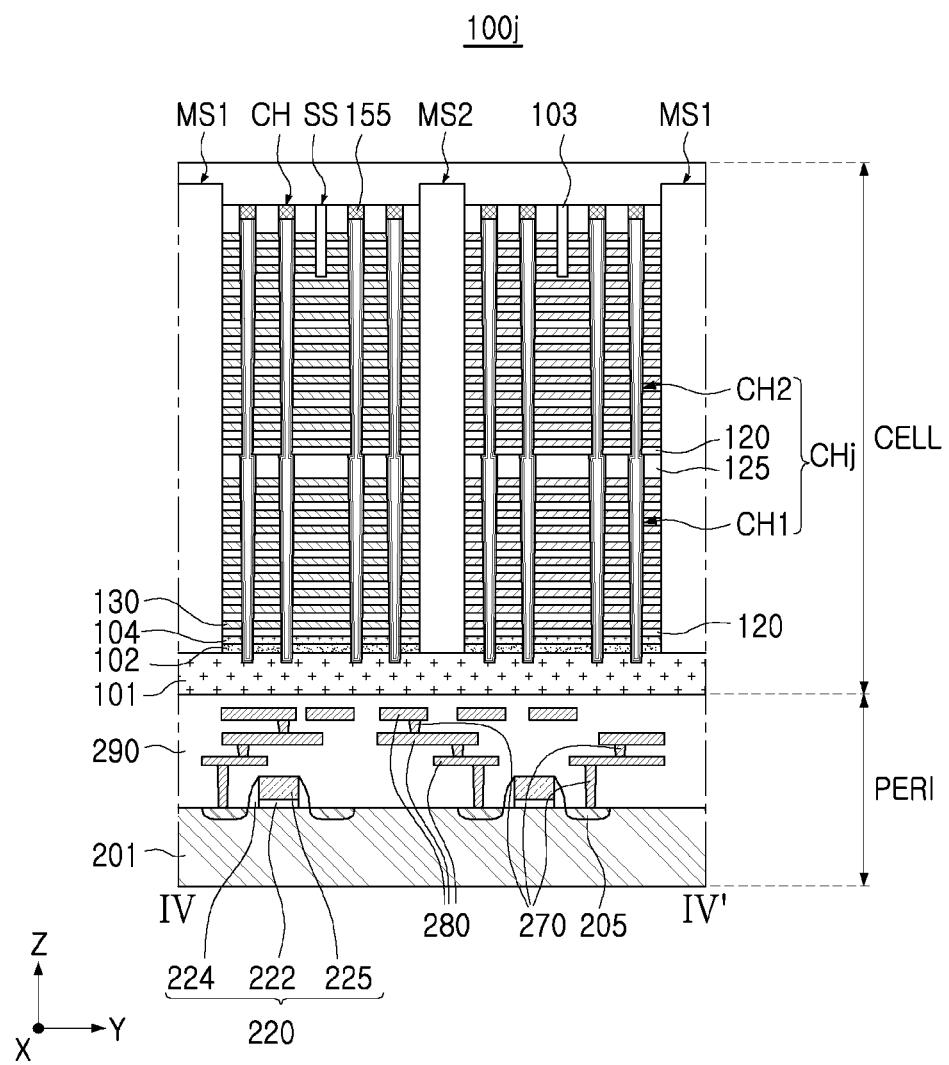

FIGS. 11A and 11B are a schematic plan view and a schematic cross-sectional view of a semiconductor device according to example embodiments, respectively. FIG. 11B illustrates a cross section taken along line IV-IV' in FIG. 11A.

Referring to FIGS. 11A and 11B, in a semiconductor device 100j, a stacked structure of gate electrodes 130 may include lower and upper stacked structures stacked in a vertical direction, and channel structures CHj may include first and second channel structures CH1 and CH2 stacked in a vertical direction. Such a configuration of the channel structures CHj may be introduced to stably form the channel structures CHj when there are a great number of relatively stacked gate electrodes 130.

The channel structures CHj may have a form in which first channel structure CH1 provided therebelow and second channel structures CH2 provided thereabove are connected to each other, and have a bent portion due to a difference in width in a connection region. A channel layer 140, a gate dielectric layer 145, and a channel insulating layer 150 may be in a state in which they are connected to each other between the first channel structure CH1 and the second channel structure CH2. A channel pad 155 may be disposed on only an upper end of the upper second channel structure CH2. However, in example embodiments, each of the first channel structure CH1 and the second channel structure CH2 may include a channel pad 155. In this case, the channel pad 155 of the first channel structure CH1 may be connected to the channel layer 140 of the second channel structure CH2. An upper interlayer insulating layer 125 having a relatively great thickness may be disposed on an uppermost portion of the lower stacked structure. However, shapes of the interlayer insulating layers 120 and the upper interlayer insulating layer 125 may vary according to example embodiments.

Similarly to the embodiment of FIGS. 7A and 7B, the pad regions PAD may have different lengths in a Y direction, and lengths protruding to a through-wiring region TB may be different from each other. For example, the length of the pad regions PAD may be decreased in a direction distant from a first region A. In particular, in each of the lower and upper stacked structures, the length of the pad regions PAD may be decreased in a direction distant from the first region A. Contact plugs 180 may be spaced apart from an end portion of each of the pad regions PAD in the Y direction by a predetermined distance, but a disposition of the contact plugs 180 is not limited thereto.

FIGS. 12A, 12B, 13A, 13B, 14A, 14B, 15A, 15B, 16A, 16B, 17A, and 17B are schematic cross-sectional views illustrating a method of fabricating a semiconductor device according to example embodiments. FIGS. 12A, 12B, 13A, 13B, 14A, 14B, 15A, 15B, 16A, 16B, 17A, and 17B illustrate regions corresponding to the regions illustrated in FIGS. 2 and 3A.

Figure 12A:
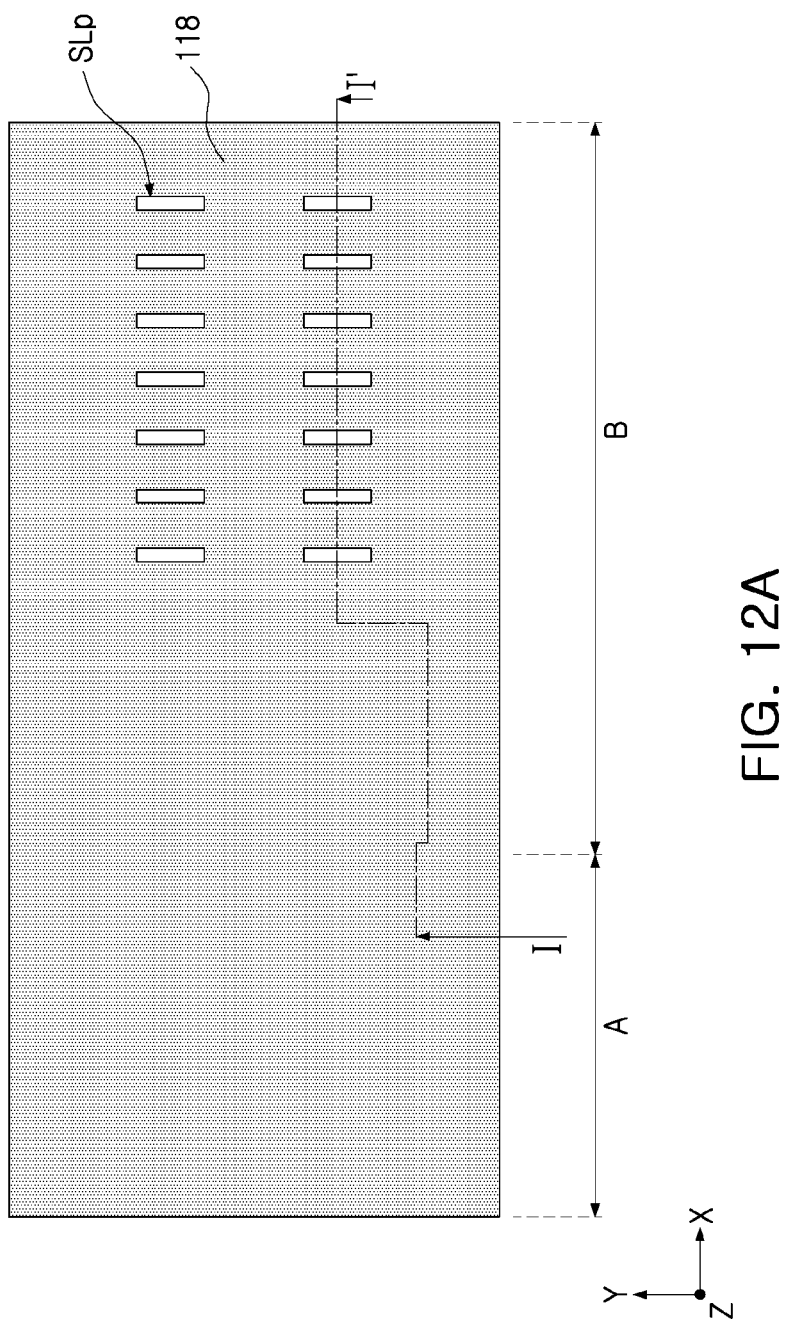
FIGS. 12A, 12B, 13A, 13B, 14A, 14B, 15A, 15B, 16A, 16B, 17A, and 17B are schematic cross-sectional views illustrating a method of fabricating a semiconductor device according to example embodiments.
Figure 12B:
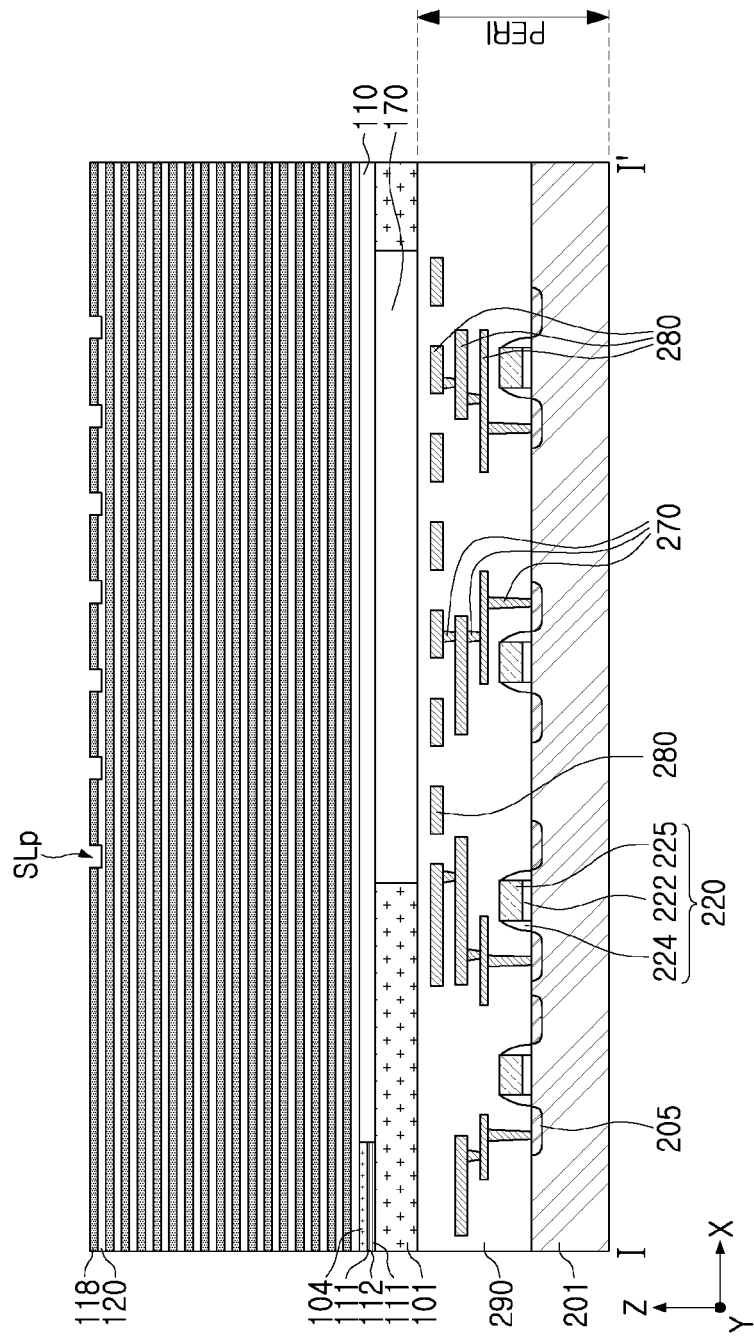

Referring to FIGS. 12A and 12B, a peripheral circuit region PERI including circuit elements 220 and lower wiring structures may be formed on a base substrate 201. After a substrate 101 provided with a memory cell region, may be formed on a peripheral circuit region PERI, a substrate insulating layer 170 may be formed, first and second source sacrificial layers 111 and 112 and a second horizontal conductive layer 104 may be formed, sacrificial insulating layers 118 and interlayer insulating layers 120 may be alternately stacked, and then preliminary slit regions SLp may be formed.

A circuit gate dielectric layer 222 and a circuit gate electrode 225 may be sequentially formed on a base substrate 201. The circuit gate dielectric layer 222 and the circuit gate electrode 225 may be formed using atomic layer deposition (ALD) or chemical vapor deposition (CVD). The circuit gate dielectric layer 222 may be formed of a silicon oxide, and the circuit gate electrode 225 may be formed of at least one of polycrystalline silicon or metal silicide, but materials thereof are not limited thereto. Spacer layers 224 and source/drain regions 205 may be formed on both sidewalls of the circuit gate dielectric layer 222 and the circuit gate electrode 225. In example embodiments, the spacer layer 224 may include a plurality of layers. Then, an ion implantation process may be performed to form source/drain regions 205.

In the lower wiring structures, the circuit contact plugs 270 may be formed by forming a portion of a peripheral region insulating layer 290, etching the portion to be removed, and filling the removed portion with a conductive material. Lower wiring lines 280 may be formed by, for example, depositing a conductive material and patterning the deposited conductive material.

The peripheral region insulating layer 290 may include a plurality of insulating layers. A portion of the peripheral region insulating layer 290 may be formed in each operation of forming the lower wiring structures, and the other portion thereof may be formed on an uppermost lower wiring line 280. Ultimately, the peripheral region insulating layer 290 may be formed to cover the circuit elements 220 and the lower wiring structure structures.

The substrate 101 may be formed on the peripheral region insulating layer 290. The substrate 101 may be formed of, for example, polycrystalline silicon and may be formed by a chemical vapor deposition (CVD) process. The polycrystalline silicon, forming the substrate 101, may include impurities. The substrate 101 may be formed to have a size smaller than or equal to a size of the base substrate 201. The substrate insulating layer 170 may be formed by removing the substrate 101 in a portion of the substrate 101, for example, a region corresponding to a through-wiring region TB (see FIG. 2) and filling the removed portion with an insulating material.

The first and second source sacrificial layers 111 and 112 may be stacked on the substrate 101 such that the first source sacrificial layers 111 are disposed above and below the second source sacrificial layer 112. The first and second source sacrificial layers 111 and 112 may include different materials from each other. The first and second source sacrificial layers 111 and 112 may be replaced with the first horizontal conductive layer 102 of FIG. 3A through a subsequent process. For example, the first source sacrificial layer 111 may be formed of the same material as the interlayer insulating layers 120, and the second source sacrificial layer 112 may be formed of the same material as the sacrificial insulating layers 118. A second horizontal conductive layer 104 may be formed on the first and second source sacrificial layers 111 and 112. The first and second source sacrificial layers 111 and 112 and the second horizontal conductive layer 104 may be removed in a second region B, and a horizontal insulating layer 110 may be formed in the removed region.

The sacrificial insulating layers 118 may having a portion to be replaced with gate electrodes 130 (see FIG. 3A) through a subsequent process. The sacrificial insulating layers 118 may be formed of a material different from a material of the interlayer insulating layers 120, and may be formed of a material which may be etched with an etch selectivity with respect to the interlayer insulating layers 120 under a specific etching condition. For example, the interlayer insulating layer 120 may be formed of at least one of a silicon oxide and a silicon nitride, and the sacrificial insulating layers 118 may be formed of a material different from a material selected from silicon, silicon oxide, silicon carbide, and silicon nitride. In example embodiments, thicknesses of the interlayer insulating layers 120 may not all be the same. The thicknesses and the number of the interlayer insulating layers 120 and the sacrificial insulating layers 118 may vary from those illustrated in the drawings.

A portion of a stacked structure of the sacrificial insulating layers 118 and the interlayer insulating layers 120 may be removed from an upper surface to form preliminary slit regions SLp. In a location corresponding to the slit regions SL of FIG. 3A, the preliminary slit regions SLp may penetrate through an uppermost sacrificial insulating layer 118 and may extend to a portion of the lower interlayer insulating layer 120 to expose the interlayer insulation layer 120.

Figure 13A:
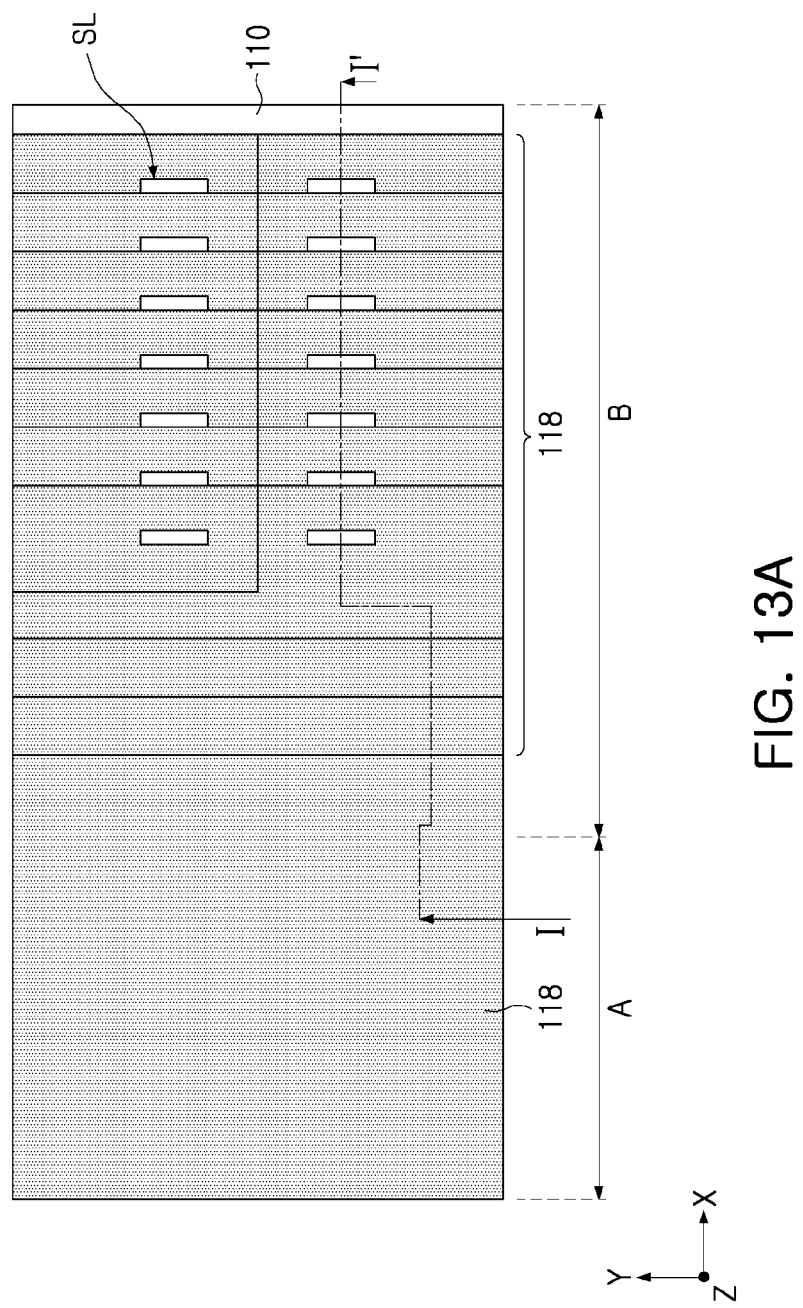
Figure 13B:
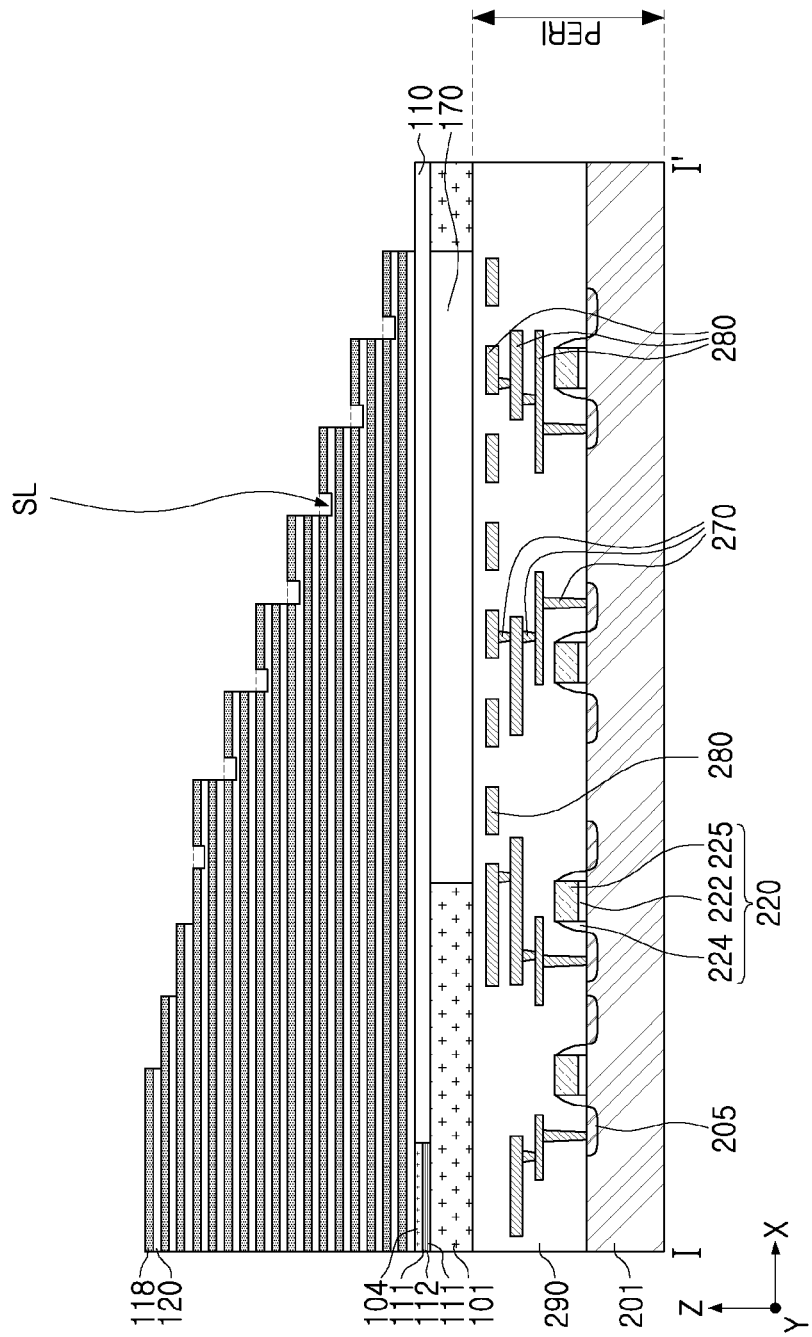

Referring to FIGS. 13A and 13B, in the second region B, a portion of the stacked structures of the sacrificial insulating layers 118 and the interlayer insulating layers 120 may be removed and slit regions SL may be formed.

A photolithography process and an etching process may be repeatedly performed on the sacrificial insulating layers 118 using mask layers such that the upper sacrificial insulating layers 118 extends to be shorter than the underlying sacrificial insulating layers 118 in the second region B. Thus, the sacrificial insulating layers 118 may form a stepped structure in units of predetermined groups. During the above process, the shape of the preliminary slit regions SLp may be reflected to a lower portion of the stacked structure to form slit regions SL disposed adjacent to the stepped structure.

Figure 14A:
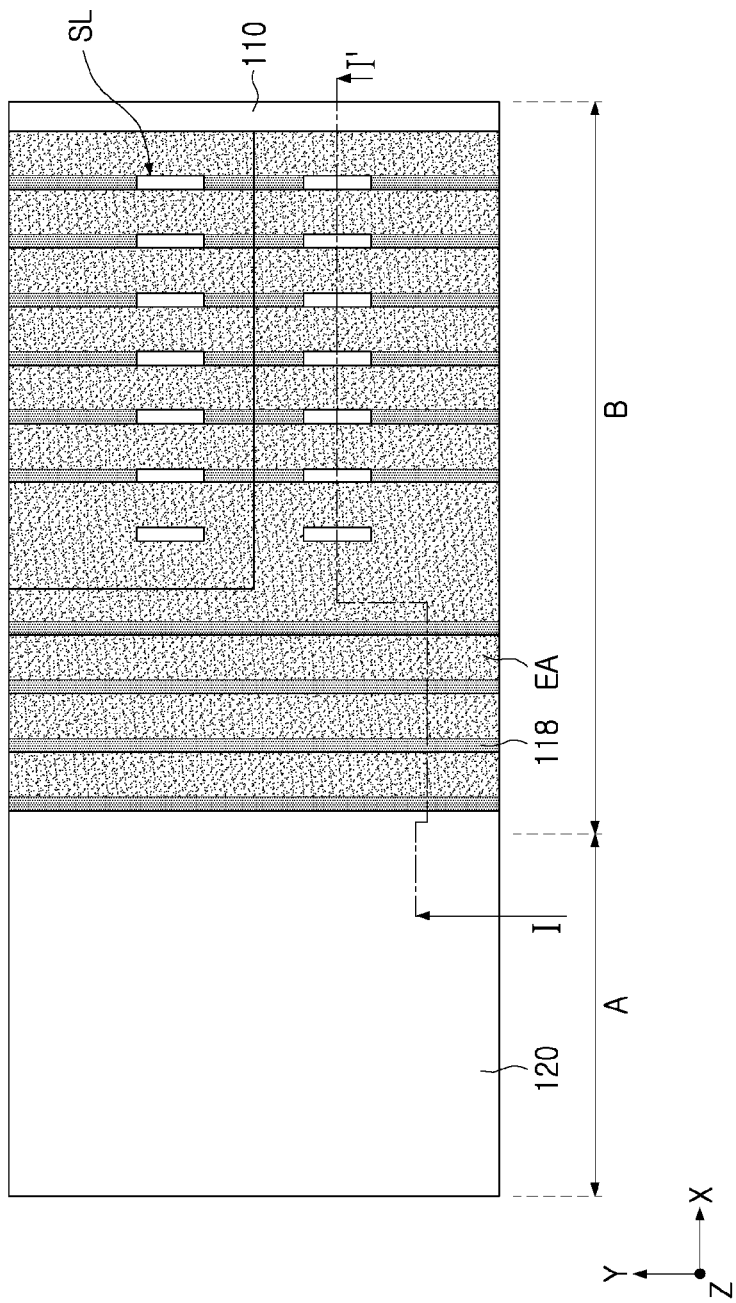
Figure 14B:
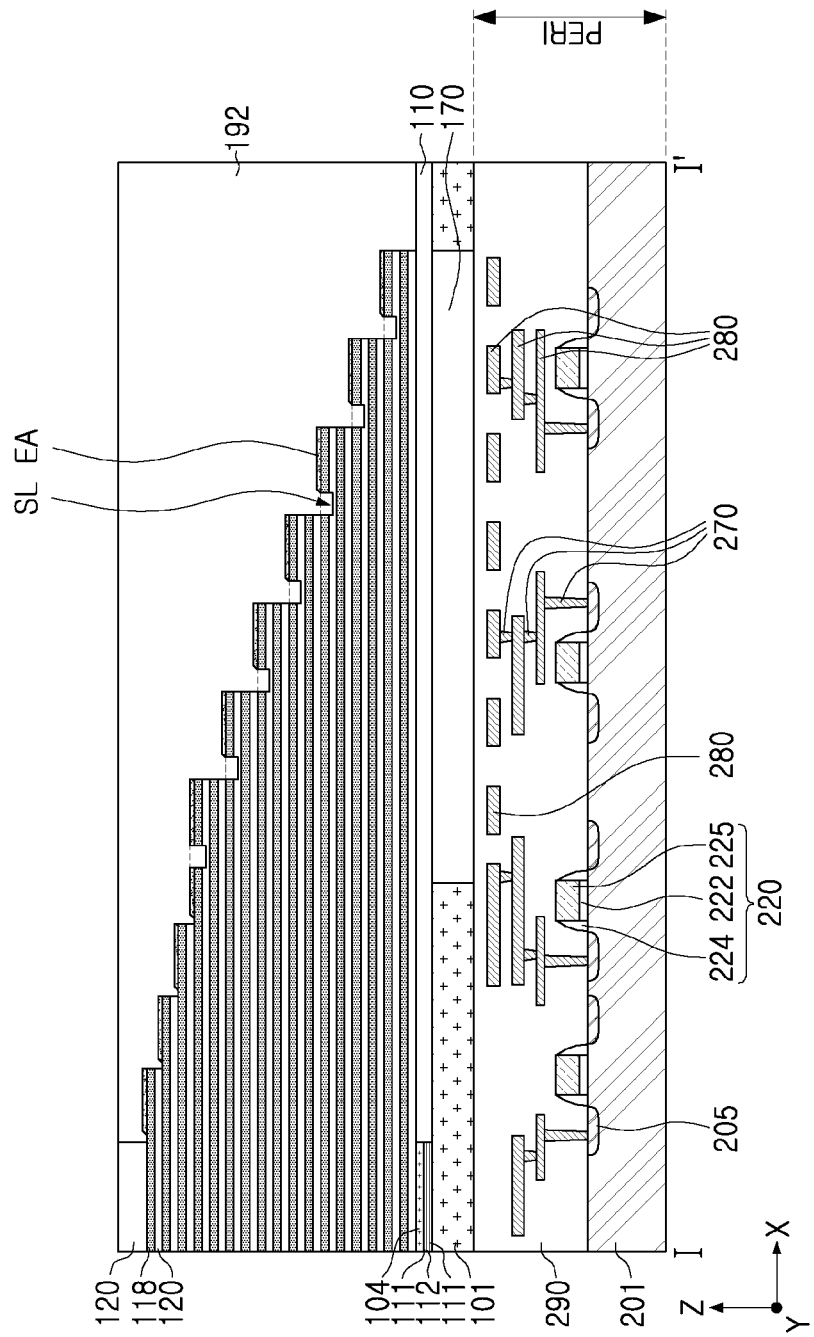

Referring to FIGS. 14A and 14B, additional sacrificial insulating layers EA may be formed on a portion of the sacrificial insulating layers 118, so that end portions of the sacrificial insulating layers 118 may be formed to have a great thickness.

The additional sacrificial insulating layers EA may be formed on an end portion of the sacrificial insulating layers 118 in an X direction to have a predetermined width. The additional sacrificial insulating layers EA may constitute a portion of the sacrificial insulating layers 118. In FIGS. 14A, 14B, 15A and 15B, the additional sacrificial insulating layers EA are illustrated to be distinguished from the sacrificial insulating layers 118 formed in advance.

Prior to formation of the additional sacrificial insulating layers EA, a spacer layer may be formed to cover sidewalls of a stepped structure of the sacrificial insulating layers 118. Then, the additional sacrificial insulating layers EA may be formed and the spacer layer may be removed. A length of the additional sacrificial insulating layers EA in the X direction may be smaller than or equal to a length of the sacrificial insulating layers 118 in the X direction. In FIG. 14A, a left end portion of the additional sacrificial insulating layers EA is illustrated as being disposed on the same line as a right end portion of slit regions SL in a Y direction. However, the arrangements of the additional sacrificial insulating layers EA and the slit region SL are not limited thereto.

The additional sacrificial insulating layers EA may include a material having a composition different from a composition of a material of the sacrificial insulating layers 118 formed in advance. For example, both the additional sacrificial insulating layers EA and the sacrificial insulating layers 118 may include a silicon nitride, but may have different ratios of silicon (Si) and nitrogen (N), or the additional sacrificial insulating layers EA may include a greater amount of impurities.

A first cell region insulating layer 192 may be formed to cover an upper portion of the stacked structure of the sacrificial insulating layers 118 and the interlayer insulating layers 120.

Figure 15A:
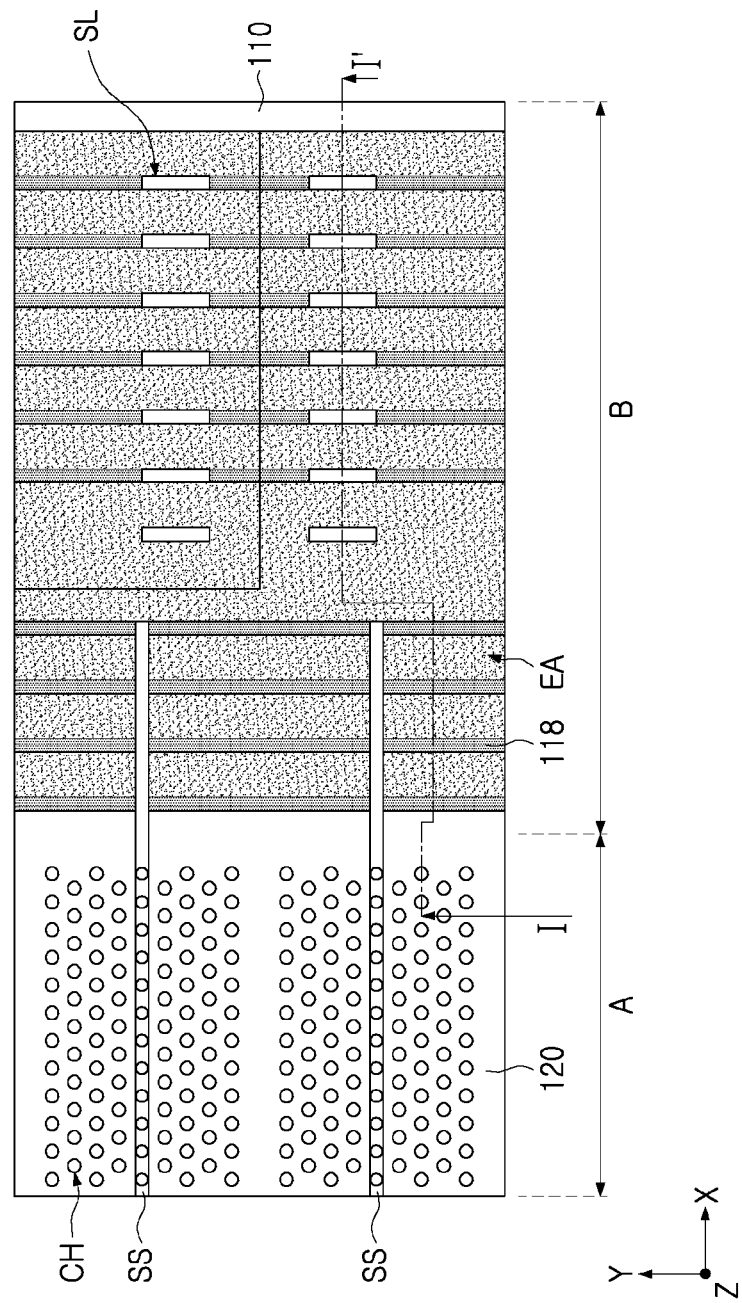
Figure 15B:
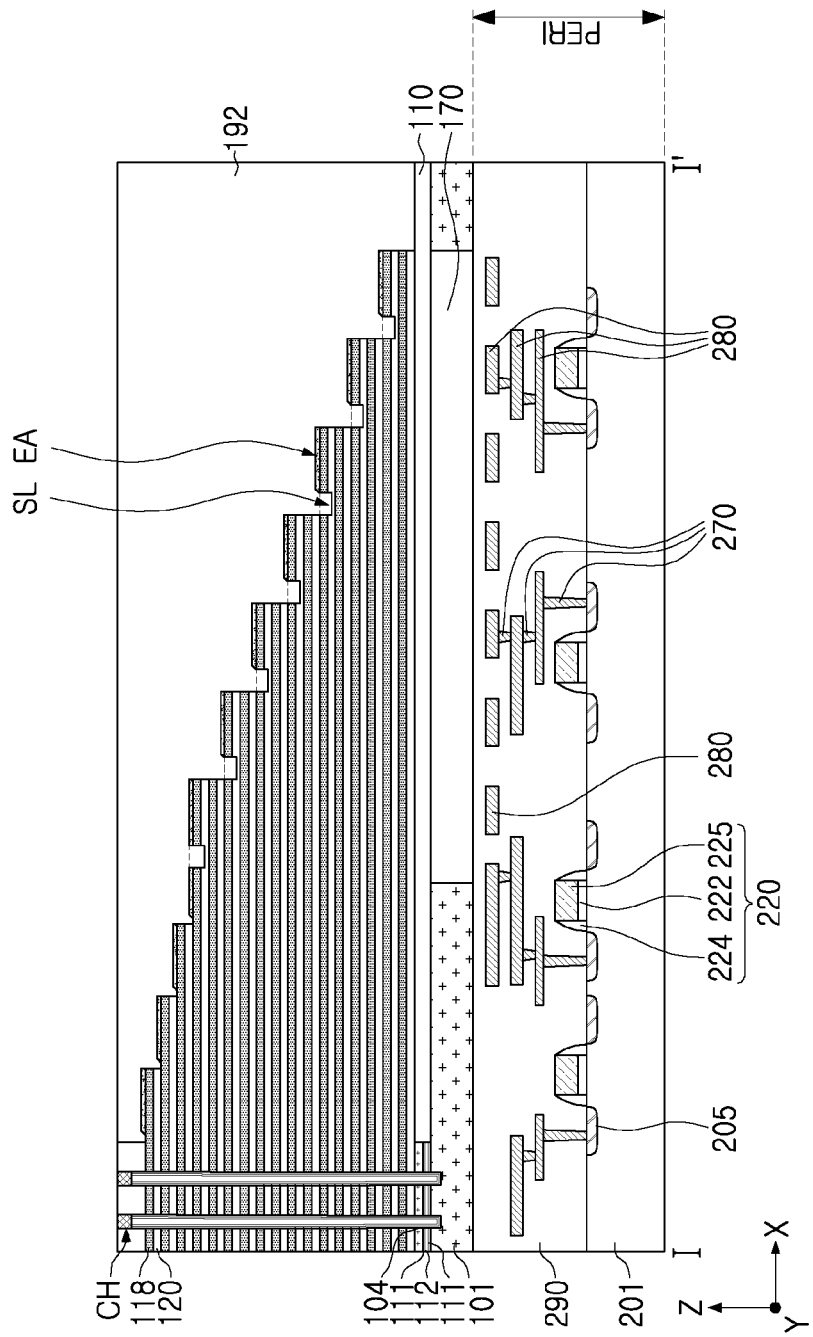

Referring to FIGS. 15A and 15B, channel structures CH may be formed through the stacked structures of the sacrificial insulating layers 118 and the interlayer insulating layers 120.

Portions of the sacrificial insulating layers 118 and the interlayer insulating layers 120 may be removed to form upper separation regions SS. The upper separation regions SS may be formed by exposing a region, in which the upper separation regions SS are to be formed, using an additional mask layer, removing a predetermined number of sacrificial insulating layers 118 and interlayer insulating layers 120 form an uppermost portion, and depositing an insulating material. However, in example embodiments, upper separation regions SS may be formed before or after formation of preliminary slit regions SLp in the processes described with reference to FIGS. 12A and 12B.

The channel structures CH may be formed by anisotropically etching the sacrificial insulating layers 118 and the interlayer insulating layers 120, and may be formed by forming hole-shaped channel holes and filling the channel holes. Due to a height of the stacked structure, sidewalls of the channel structures CH may not be perpendicular to an upper surface of the substrate 101. The channel structures CH may be formed to recess a portion of the substrate 101. At least a portion of a gate dielectric layer 145, a channel layer 140, a channel insulating layer 150, and channel pads 155 may be sequentially formed in the channel structures CH.

The gate dielectric layer 145 may be formed to have a uniform thickness using an ALD or CVD process. In this operation, the entirety or a portion of the gate dielectric layer 145 may be formed, and a portion extending in a direction perpendicular to the substrate 101 along the channel structures CH may be formed. The channel layer 140 may be formed on the gate dielectric layer 145 in the channel structures CH. The channel insulating layer 150 is formed to fill the channel structures CH and may include an insulating material. However, in example embodiments, a space inside the channel layer 140 may be filled with a conductive material, rather than the channel insulating layer 150. The channel pad 155 may be formed of a conductive material, for example, polycrystalline silicon.

Figure 16A:
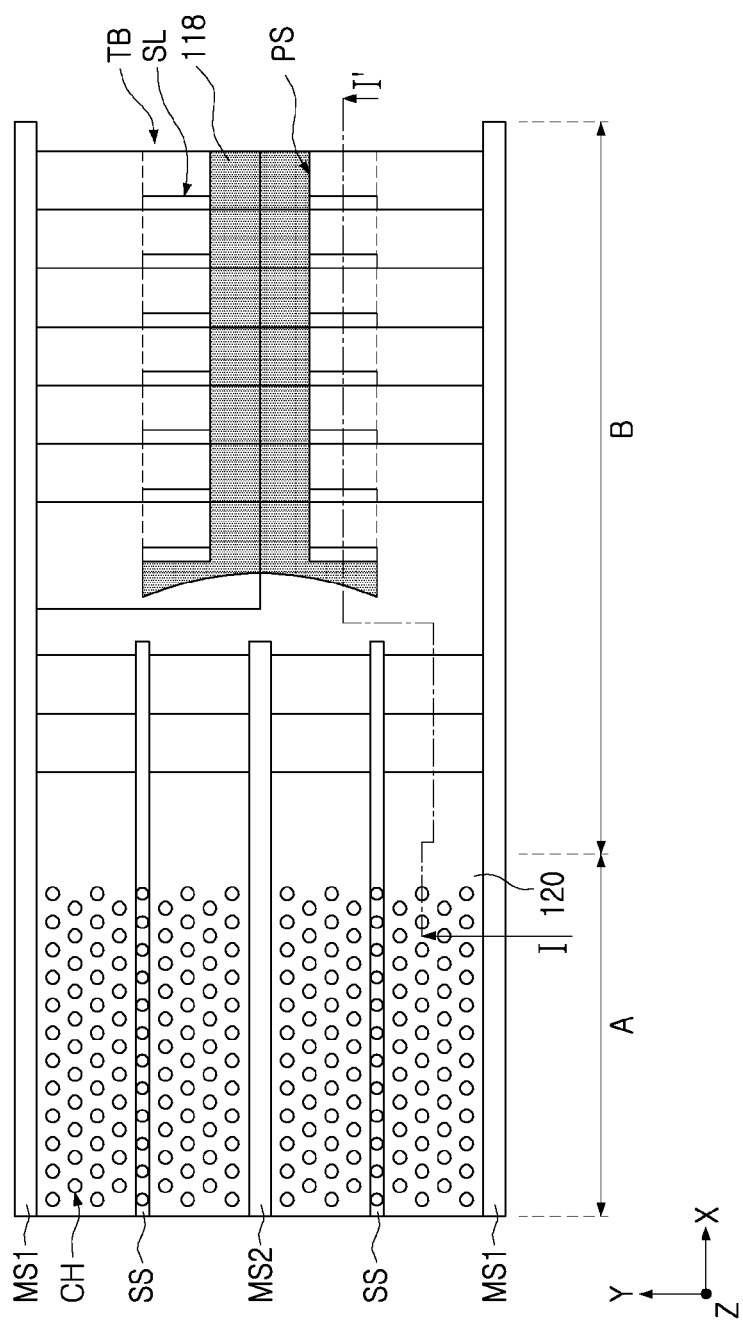
Figure 16B:
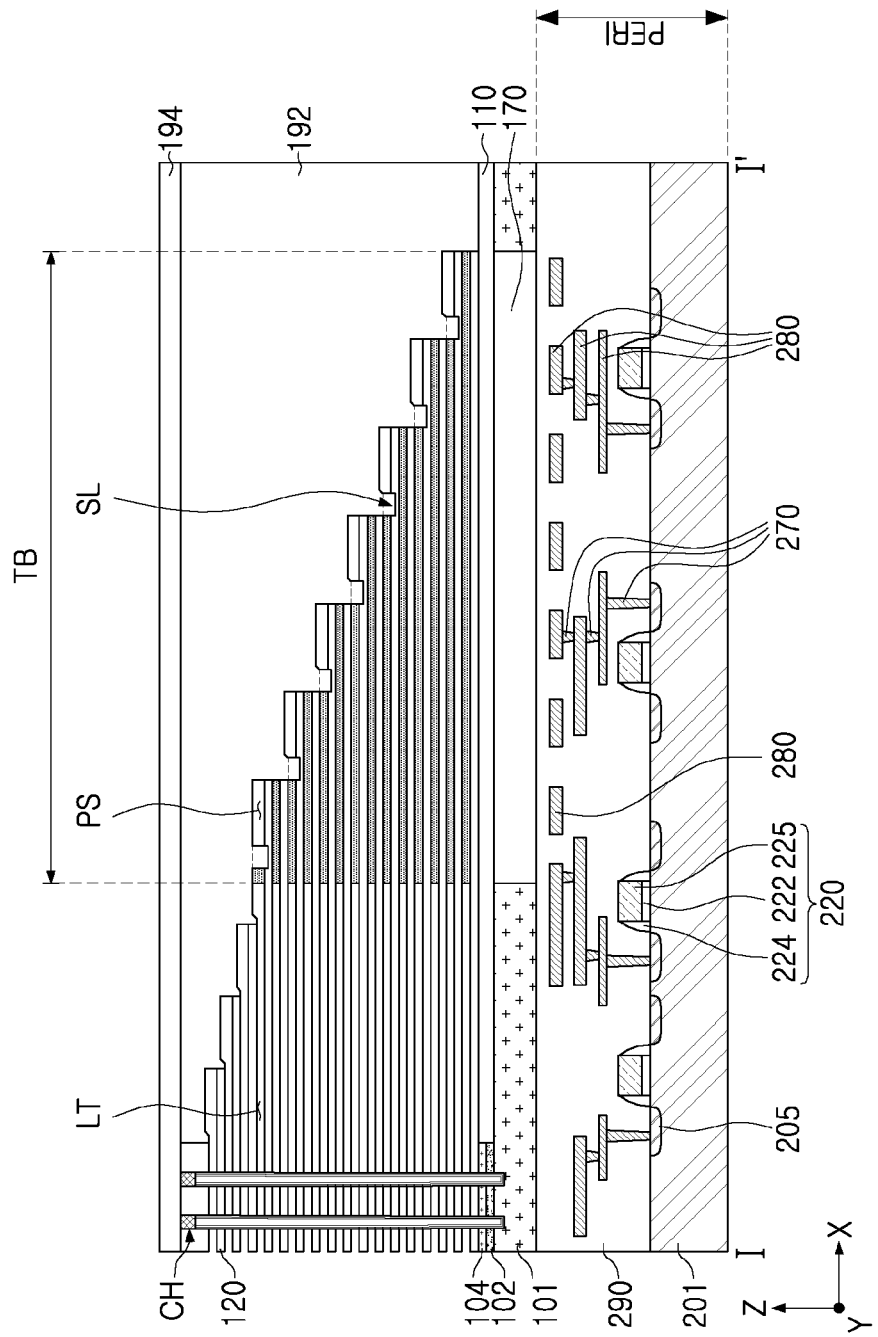

Referring to FIGS. 16A and 16B, first and second separation regions MS1 and MS2 may be formed in the form of openings to penetrate through the stacked structure of the sacrificial insulating layers 118 and the interlayer insulating layers 120. Portions of the sacrificial insulating layers 118 may be removed through the openings to form tunnel portions LT and pad spaces PS.

Prior to formation of the first and second separation regions MS1 and MS2, a portion of a second cell region insulating layer 194 may be formed on the channel structures CH. After additional sacrificial spacer layers are formed in the first and second separation regions MS1 and MS2, the second horizontal sacrificial layer 112 may be selectively removed and the first horizontal sacrificial layers 111 may be then removed. The first and second horizontal sacrificial layers 111 and 112 may be removed by, for example, a wet etching process. In the process of removing the first horizontal sacrificial layers 111, an exposed portion of the gate dielectric layer 145 may also be removed in a region in which the second horizontal sacrificial layer 112 is removed. A conductive material may be deposited on a region, in which the first and second horizontal sacrificial layers 111 and 112 are removed, to form a first horizontal conductive layer 102, and the sacrificial spacer layers may be then removed in the first and second separation regions MS1 and MS2.

The sacrificial insulating layers 118 may be removed on an external side of the through-wiring region TB. In the through-wiring region TB, the sacrificial insulating layers 118 may remain and constitute an insulating region of the through-wiring region TB together with the interlayer insulating layers 120. The sacrificial insulating layers 118 may be selectively removed with respect to the interlayer insulating layers 120 using wet etching, for example. Accordingly, a plurality of tunnel portions LT may be formed between the interlayer insulating layers 120 and pad spaces PS may be formed in a region corresponding to the pad regions PAD.

A region, in which the through-wiring region TB is formed, is spaced apart from the first and second separation regions MS1 and MS2. Accordingly, since an etchant does not reach the region, the sacrificial insulating layers 118 may remain in the region. Thus, the through-wiring region TB is formed in a center of the first and second separation regions MS1 and MS2 between the first and second separation regions MS1 and MS2 adjacent to each other. In this case, in the sacrificial insulating layers 118, the exposed upper region corresponding to the additional sacrificial insulating layers EA described above with reference to FIGS. 14A and 14B may have an etching rate different from an etching rate of another region formed therebelow and may be etched relatively rapidly in the wet etching process. Accordingly, in the sacrificial insulating layers 118 exposed upwardly, the process of removing the sacrificial insulating layers 118 may be performed relatively rapidly in the Y direction in which the additional sacrificial insulating layers EA are disposed. As a result, pad spaces PS may be formed.

During the wet etching process, internal boundaries of the pad spaces PS may be controlled by the slit regions SL. Thus, the pad spaces PS may be spaced apart from each other in the X direction so as not to overlap each other on a plane. For example, in the absence of the slit regions SL, left boundaries of the pad spaces PS may be formed to have an inclination similar to an inclination of a left end portion of the through-wiring region TB of FIG. 16A, and certain regions may be formed to vertically overlap each other between the vertically stacked pad spaces PS. However, in this embodiment, since an etchant does not flow to a region in which the slit regions SL are formed, the pad spaces PS may be completely spaced apart from each other in the X direction so as not to vertically overlap each other.

Figure 17A:
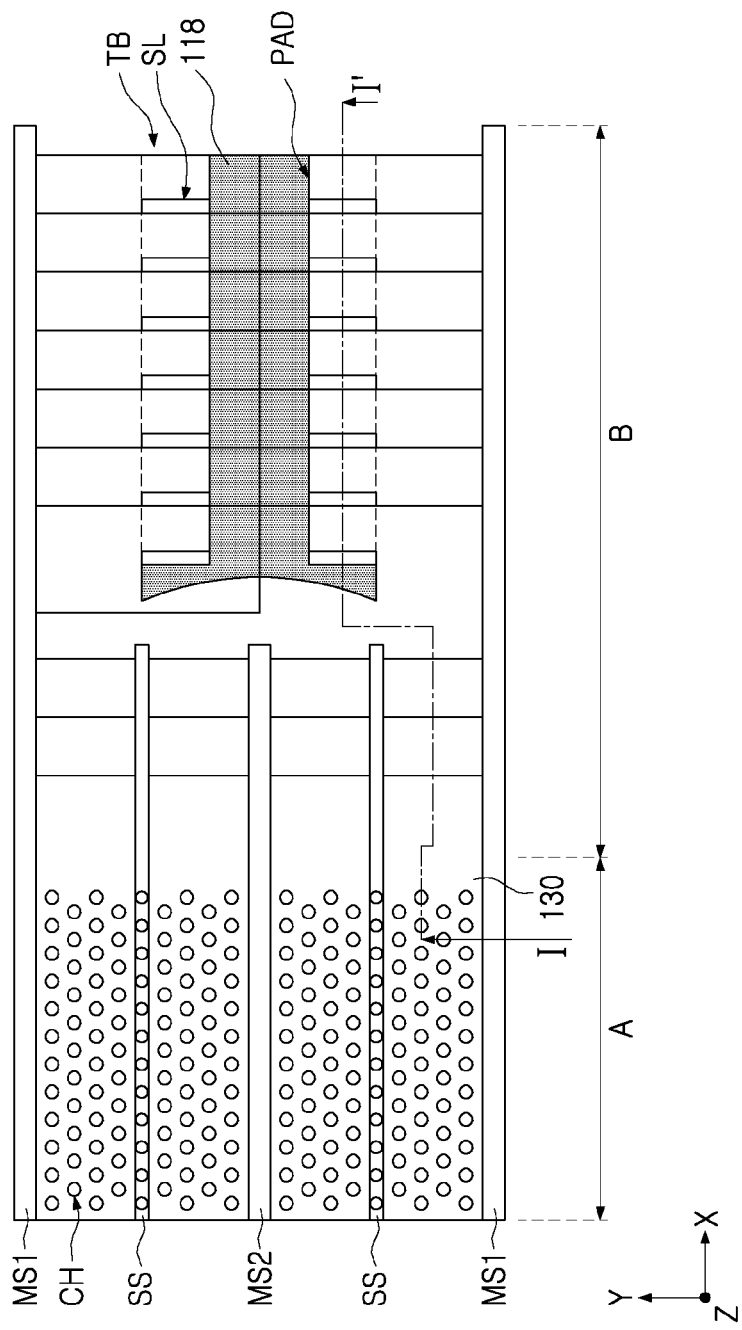
Figure 17B:
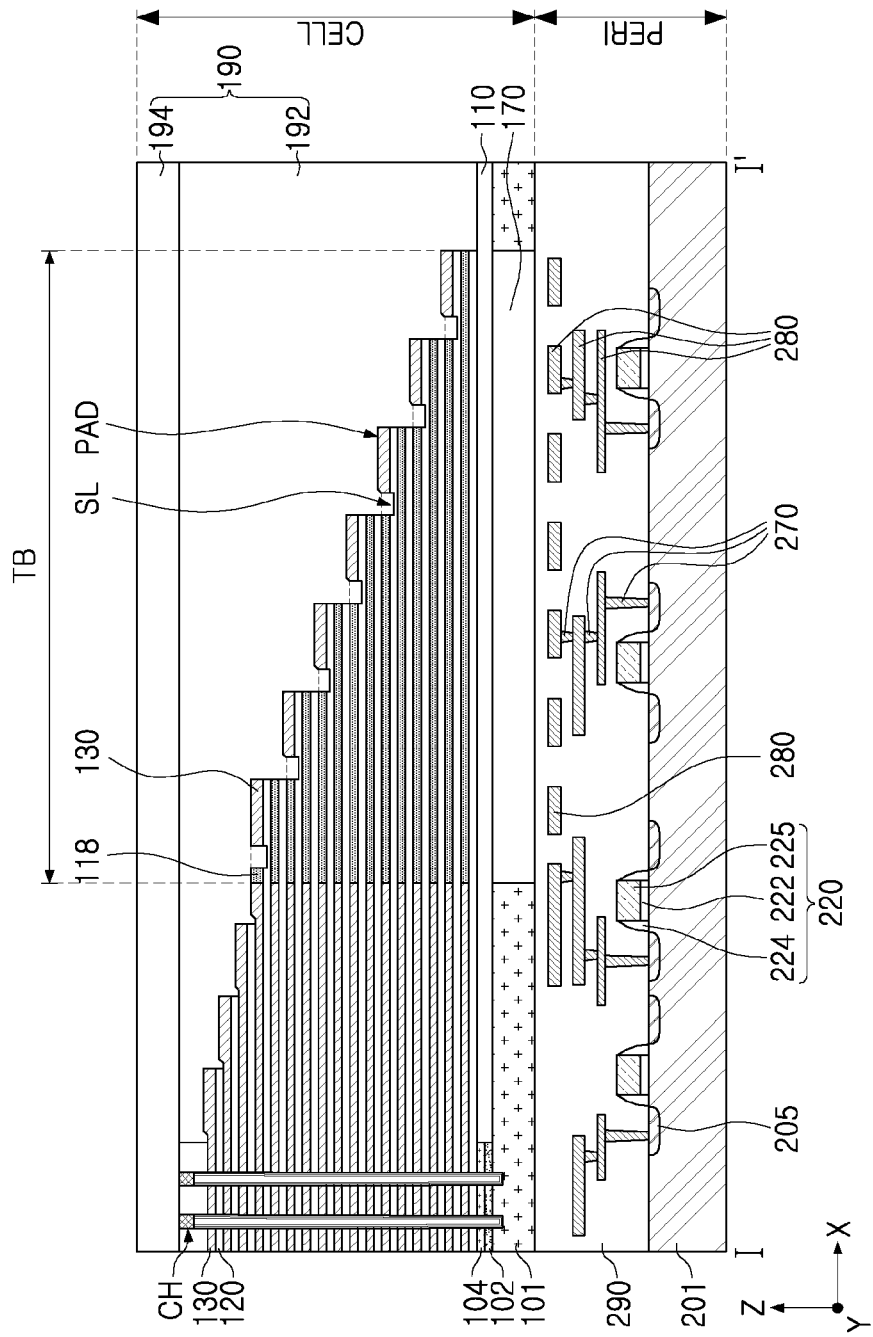

Referring to FIGS. 17A and 17B, the pad spaces PS and the tunnel portions LT, in which a portion of the sacrificial insulating layers 118 is removed, may be filled with a conductive material to form gate electrodes 130.

The conductive material, forming the gate electrodes 130, may fill the tunnel portions LT and the pad spaces PS. In the through-wiring region TB, the conductive materials filling the pad spaces PS may form the pad regions PAD of the gate electrodes 130. Side surfaces of the gate electrodes 130 may be in contact with side surfaces of the sacrificial insulating layers 118 of the through-wiring region TB. The conductive material may include a metal, polycrystalline silicon, or a metal silicide material.

After the formation of the gate electrodes 130, the conductive material deposited in the openings of the first and second separation regions MS1 and MS2 may be removed through an additional process. Then, the removed portion may be filled with an insulating material to form a separation insulating layer 160 (see FIGS. 3C and 3D).

A second cell region insulating layer 194 may be further formed to form a cell region insulating layer 190 including the first and second cell region insulating layers 192 and 194.

Returning to FIGS. 2 and 3A through 3D, contact plugs 180 and through-vias 185 may be formed.

Contact holes may be formed and then filled with a conductive material to form the contact plugs 180 and the through-vias 185. The contact holes may extend from above to penetrate through the substrate 101, and may expose circuit wiring lines 280 of a peripheral circuit region PERI on lower ends thereof. Then, wiring lines may be further formed to be connected to the through-vias 185.

As described above, a slit region may be formed to be in contact with a pad region of a gate electrode. Thus, a semiconductor device having improved reliability may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
a peripheral circuit region provided on a first substrate and including circuit elements and a wiring structure on the circuit elements;
a memory cell region provided on a second substrate disposed above the first substrate, the memory cell region including:
gate electrodes stacked to be spaced apart from each other in a first direction, perpendicular to an upper surface of the second substrate, in a first region of the second substrate, the gate electrodes extending in a form of a staircase in a second direction, perpendicular to the first direction, in a second region of the second substrate;
interlayer insulating layers stacked alternately with the gate electrodes, and
channel structures disposed in the first region, to penetrate through the gate electrodes and to extend in the first direction, each including a channel layer; and
a through-wiring region disposed in the second region, the through-wiring region including:
sacrificial insulating layers extending from the gate electrodes to be stacked alternately with the interlayer insulating layers, and
contact plugs electrically connecting the gate electrodes and the wiring structure to each other,
wherein the gate electrodes include pad regions disposed to overlap the through-wiring region on end portions of the gate electrodes and exposed with respect to the interlayer insulating layers and the sacrificial insulating layers, and
wherein the through-wiring region includes slit regions disposed to respectively penetrate through the sacrificial insulating layers on one side of respective pad regions.

2. The semiconductor device of claim 1, wherein each of the slit regions is disposed to penetrate a corresponding sacrificial insulating layer at the same level as a corresponding pad region and to expose a corresponding interlayer insulating layer disposed below a corresponding gate electrode.

3. The semiconductor device of claim 1, wherein each slit region is disposed on the one side of a respective pad region, to be between the respective pad region and the first region of the second substrate.

4. The semiconductor device of claim 1, wherein each of the slit regions is disposed between two pad regions adjacent to each other in the second direction,
wherein the two pad regions include a first pad region and a second pad region lower than the first pad region.

5. The semiconductor device of claim 1, wherein the pad regions extend in a third direction perpendicular to the first and second directions, and
wherein a first length of the slit regions in the third direction is greater than a second length of the slit regions in the second direction.

6. The semiconductor device of claim 5, wherein the pad regions have a third length in the third direction, and
wherein the first length is approximately 80 percent or more of the third length.

7. The semiconductor device of claim 5, wherein the second length ranges from approximately 30 nm to approximately 130 nm.

8. The semiconductor device of claim 1, wherein the memory cell region further includes a cell region insulating layer covering the gate electrodes, and
wherein the cell region insulating layer fills the slit regions.

9. The semiconductor device of claim 1, wherein the slit regions include bent portions conforming to a shape of end portions of the pad regions and the end portions of the gate electrodes.

10. The semiconductor device of claim 1, wherein each of the pad regions extends in a third direction perpendicular to the first and second directions, and
wherein in the third direction, the pad regions have different lengths from each other overlapping the through-wiring region.

11. The semiconductor device of claim 1, wherein the contact plugs penetrate the gate electrodes in the pad regions, respectively, and extend to the peripheral circuit region through the second substrate.

12. The semiconductor device of claim 11, wherein each of the contact plugs penetrates through one of the gate electrodes and at least one of the sacrificial insulating layers below the one of the gate electrodes.

13. The semiconductor device of claim 1, wherein the memory cell region further includes separation regions penetrating through the gate electrodes and extending in the second direction, and
wherein the through-wiring region is spaced apart from the separation regions.

14. A semiconductor device comprising:
a peripheral circuit region provided on a first substrate and including circuit elements;
a memory cell region provided on a second substrate disposed above the first substrate, the memory cell region including:

gate electrodes stacked to be spaced apart from each other on the second substrate in a first direction, the gate electrodes extending by different lengths in a second direction perpendicular to the first direction, and a cell region insulating layer covering the gate electrodes; and a through-wiring region including sacrificial insulating layers disposed to extend from the gate electrodes, wherein each of the gate electrodes includes a pad region bent to extend in a third direction, perpendicular to the first and second directions, and to protrude from an end portion of each of the gate electrodes in the second direction to the through-wiring region, and wherein opposite side surfaces of the pad region in the second direction are covered with the cell region insulating layer.

15. The semiconductor device of claim 14, wherein the pad region is spaced apart from a corresponding sacrificial insulating layer disposed at the same height as a corresponding gate electrode, by the cell region insulating layer.

16. The semiconductor device of claim 14, wherein the gate electrodes include a first gate electrode and a second gate electrode on the first gate electrode extending to be shorter than the first gate electrode in the second direction such that a first pad region of the first gate electrode is exposed, and wherein the cell region insulating layer extends between the first pad region of the first gate electrode and a second pad region of the second gate electrode.

17. A semiconductor device comprising:

gate electrodes stacked to be spaced apart from each other on a substrate in a first direction, perpendicular to an upper surface of the substrate, the gate electrodes extending in a second direction perpendicular to the first direction and including pad regions bent in a third direction perpendicular to the first and second directions;

interlayer insulating layers stacked alternately with the gate electrodes;

channel structures penetrating through the gate electrodes, extending in the first direction, and including a channel layer;

separation regions penetrating through the gate electrodes, extending in the second direction, and spaced apart from each other to be parallel to each other; and a through-wiring region spaced apart from the separation regions to overlap the pad regions between the separation regions adjacent to each other, including contact plugs penetrating through the pad regions, and including sacrificial insulating layers extending from the gate electrodes to be stacked alternately with the interlayer insulating layers, wherein the through-wiring region includes slit regions, and each of the slit regions is disposed to penetrate through the sacrificial insulating layers on one side of a respective pad region.

18. The semiconductor device of claim 17, wherein each of the slit regions is disposed between a corresponding pad region and a corresponding sacrificial insulating layer disposed at the same level.

19. The semiconductor device of claim 17, further comprising:

dummy channel structures disposed on external sides of the channel structures and having an internal structure corresponding to the channel structures, wherein the slit regions include a structure corresponding to the dummy channel structures.

20. The semiconductor device of claim 17, wherein the slit regions form a columnar insulating layer extending in the first direction.

* * * * *